US008718223B2

(12) United States Patent
Murakami et al.

(10) Patent No.: US 8,718,223 B2
(45) Date of Patent: May 6, 2014

(54) SEMICONDUCTOR DEVICE AND DISPLAY DEVICE

(75) Inventors: Yuhichiroh Murakami, Osaka (JP); Yasushi Sasaki, Osaka (JP); Shige Furuta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 102 days.

(21) Appl. No.: 12/734,044

(22) PCT Filed: Aug. 26, 2008

(86) PCT No.: PCT/JP2008/065183
§ 371 (c)(1),
(2), (4) Date: Apr. 7, 2010

(87) PCT Pub. No.: WO2009/084272
PCT Pub. Date: Jul. 9, 2009

(65) Prior Publication Data
US 2010/0244946 A1    Sep. 30, 2010

(30) Foreign Application Priority Data

Dec. 28, 2007    (JP) ................................ 2007-339355

(51) Int. Cl.
*G11C 19/00*    (2006.01)
(52) U.S. Cl.
USPC .................... 377/64; 377/69; 377/78; 377/79
(58) Field of Classification Search
USPC ................. 327/108, 427, 148, 157, 534–537; 331/18, 19, 25, 34
See application file for complete search history.

(56) References Cited

U.S. PATENT DOCUMENTS

| 3,675,043 A | 7/1972 | Bell |
| 4,716,303 A | 12/1987 | Mimoto |

(Continued)

FOREIGN PATENT DOCUMENTS

| CN | 1782834 | 6/2006 |
| CN | 1825415 | 8/2006 |

(Continued)

OTHER PUBLICATIONS

Notice of Allowance for corresponding Russian patent application No. 2010123377 mailed Jul. 15, 2011 (with English translation).

(Continued)

*Primary Examiner* — Tuan T Lam
(74) *Attorney, Agent, or Firm* — Harness, Dickey & Pierce, P.L.C.

(57) ABSTRACT

A circuit is constituted by a plurality of n-channel-type transistors, the circuit including: among the plurality of transistors, a transistor including a drain terminal for receiving a voltage of VDD, a source terminal, and a gate terminal for receiving an input signal; among the plurality of transistors, a transistor including a drain terminal for receiving the voltage of VDD, a source terminal connected to an output terminal, and a gate terminal connected to the source terminal of the transistor; and a capacitor provided between a node and a clock terminal for receiving a clock signal. In at least one embodiment, the clock signal inputted into the clock terminal has a frequency higher than that of an output signal outputted from the output terminal. Therefore, it is possible to provide: a semiconductor device constituted by transistors of the same conductivity type, which semiconductor device can output a stable signal by preventing a reduction in electric potential level; and a display device including the semiconductor device.

11 Claims, 28 Drawing Sheets

(56) References Cited

U.S. PATENT DOCUMENTS

| | | | |
|---|---|---|---|
| 5,337,173 | A | 8/1994 | Atsumi et al. |
| 5,694,061 | A | 12/1997 | Morosawa |
| 5,701,136 | A | 12/1997 | Huq |
| 5,872,481 | A | 2/1999 | Sevic et al. |
| 5,949,398 | A * | 9/1999 | Kim ............................ 345/100 |
| 5,974,041 | A | 10/1999 | Kornfeld et al. |
| 6,052,426 | A * | 4/2000 | Maurice ........................... 377/78 |
| 6,064,713 | A | 5/2000 | Lebrun |
| 6,137,315 | A | 10/2000 | Zettler |
| 6,198,342 | B1 * | 3/2001 | Kawai ............................ 327/536 |
| 6,225,866 | B1 | 5/2001 | Kubota et al. |
| 6,552,187 | B1 | 4/2003 | Maetzke et al. |
| 7,176,746 | B1 * | 2/2007 | Wang et al. ..................... 327/536 |
| 7,518,407 | B2 | 4/2009 | Nonaka |
| 7,817,770 | B2 | 10/2010 | Chang et al. |
| 7,983,379 | B2 | 7/2011 | Ieong et al. |
| 8,031,160 | B2 | 10/2011 | Chen et al. |
| 8,059,780 | B2 | 11/2011 | Wang et al. |
| 8,497,833 | B2 * | 7/2013 | Park ............................ 345/100 |
| 2002/0084969 | A1 | 7/2002 | Ozawa |
| 2002/0167054 | A1 | 11/2002 | Chang et al. |
| 2004/0141273 | A1 | 7/2004 | Le |
| 2004/0155242 | A1 | 8/2004 | Segawa et al. |
| 2004/0253781 | A1 | 12/2004 | Kimura et al. |
| 2005/0122087 | A1 | 6/2005 | Sakai et al. |
| 2005/0156858 | A1 * | 7/2005 | Ahn et al. ...................... 345/100 |
| 2005/0220263 | A1 | 10/2005 | Moon |
| 2006/0001637 | A1 | 1/2006 | Pak et al. |
| 2006/0061385 | A1 | 3/2006 | Jinta et al. |
| 2006/0103429 | A1 | 5/2006 | Nonaka |
| 2006/0132418 | A1 | 6/2006 | Morita |
| 2006/0152460 | A1 | 7/2006 | Toyozawa et al. |
| 2006/0187164 | A1 | 8/2006 | Okuno |
| 2006/0208991 | A1 | 9/2006 | Uekuri et al. |
| 2006/0227096 | A1 | 10/2006 | Fujita |
| 2007/0109288 | A1 | 5/2007 | Kida |
| 2007/0132686 | A1 | 6/2007 | Kimura et al. |
| 2007/0188431 | A1 | 8/2007 | Sato et al. |
| 2007/0195920 | A1 | 8/2007 | Tobita |
| 2007/0217564 | A1 | 9/2007 | Tobita |
| 2008/0056430 | A1 | 3/2008 | Chang et al. |
| 2008/0062071 | A1 * | 3/2008 | Jeong .............................. 345/46 |
| 2008/0101529 | A1 | 5/2008 | Tobita |
| 2008/0218620 | A1 | 9/2008 | Atlas et al. |
| 2009/0310734 | A1 * | 12/2009 | Umezaki ........................ 377/64 |
| 2012/0044132 | A1 * | 2/2012 | Koga et al. .................... 345/100 |
| 2012/0170707 | A1 | 7/2012 | Hsu et al. |
| 2012/0294411 | A1 * | 11/2012 | Duan ............................. 377/64 |

FOREIGN PATENT DOCUMENTS

| | | |
|---|---|---|
| CN | 101038792 | 9/2007 |
| EP | 1 199 802 | 4/2002 |
| EP | 1 600 935 | 11/2005 |
| EP | 1 724 784 | 11/2006 |
| EP | 1 780 583 | 5/2007 |
| EP | 1 860 639 | 11/2007 |
| JP | 07-283662 A | 10/1995 |
| JP | 08-23238 A | 1/1996 |
| JP | 8-263028 | 10/1996 |
| JP | 09-246936 | 9/1997 |
| JP | 10-39277 A | 2/1998 |
| JP | 3092506 | 9/2000 |
| JP | 2001-083943 A | 3/2001 |
| JP | 2004222256 A | 8/2004 |
| JP | 2005-92783 A | 4/2005 |
| JP | 2006-127751 | 5/2006 |
| JP | 2006-148269 | 6/2006 |
| JP | 2006-178072 A | 7/2006 |
| JP | 2006-220947 | 8/2006 |
| JP | 2006-277789 A | 10/2006 |
| JP | 2006-313319 A | 11/2006 |
| JP | 2007-47703 A | 2/2007 |
| RU | 2 175 809 | 11/2001 |
| RU | 2 221 286 | 1/2004 |
| WO | WO 2009/084271 | 8/2008 |
| WO | WO 2009/034749 | 3/2009 |
| WO | WO 2009/034750 | 3/2009 |
| WO | WO 2009/084267 | 7/2009 |

OTHER PUBLICATIONS

Abstract of JP 9246936 published on Sep. 19, 1997.
International Search Report.
Office Action for co-pending U.S. Appl. No. 12/734,363 dated Feb. 21, 2013.
Office Action for co-pending U.S. Appl. No. 12/734,376 dated Mar. 7, 2013.
Election of Species Requirement for co-pending U.S. Appl. No. 12/734,595 dated Apr. 30, 2013.
Notice of Allowance for co-pending U.S. Appl. No. 12/734,363 dated May 31, 2013.
Office Action for co-pending U.S. Appl. No. 12/734,595 dated Jul. 11, 2013.
Notice of Allowance for co-pending U.S. Appl. No. 12/734,376 dated Jul. 12, 2013.
Notice of Allowance for co-pending U.S. Appl. No. 12/734,595 dated Nov. 8, 2013.

* cited by examiner (a)

(b)

SEMICONDUCTOR DEVICE AND DISPLAY DEVICE

TECHNICAL FIELD

The present invention relates to a semiconductor device includes transistors of a same conductivity type.

BACKGROUND ART

A liquid crystal display device includes a scan signal line driving circuit and a data signal line driving circuit, each of which includes a shift resister for generating a signal for sequentially driving pixels in an array arrangement. Further, the liquid crystal display device also includes: a level shifter for converting a power supply voltage level; and a buffer which has a low output impedance and outputs an amplification signal in a broad sense, such as an amplification circuit for outputting a signal which is 100%-amplified with respect to an input signal. In a case where a CMOS transistor is used to constitute a semiconductor device, such as the shift resister or the buffer, processes for forming a p-channel and an n-channel, respectively, would be required, thereby complicating a manufacturing process for the semiconductor device. Therefore, for the sake of a simple manufacturing process for the semiconductor device, it is preferable to use a transistor of a same conductivity type, such as a unipolar-channel-type transistor (e.g. a transistor having the p-channel only). For example, Patent Literature 1 discloses a semiconductor device constituted by such unipolar transistors.

FIG. 46 is a circuit diagram illustrating an arrangement of the semiconductor device disclosed in Patent Literature 1. This semiconductor device is constituted by n-type MOS transistors.

Specifically, the semiconductor device 100 includes four n-type MOS transistors T101 to T104, and a capacitor C101. The transistor T101 is arranged such that its drain terminal is connected to a power supply VDD, and its gate terminal is connected to an input terminal IN. The transistor T103 is arranged such that its source terminal is connected to a power supply VSS, and its gate terminal receives a STOP signal (control signal). The transistor T102 is arranged such that its drain terminal is connected to a clock terminal φ, and its gate terminal is connected to (i) a source terminal of the transistor T101, and (ii) a drain terminal of the transistor T103. The transistor T104 is arranged such that (i) its drain terminal is connected to a source terminal of the transistor T102, (ii) its source terminal is connected to the power supply VSS, and (iii) its gate terminal is connected to the gate terminal of the transistor T103. A connection point between the transistors T101, T102, and T103 is a node N1, and a connection point between the transistors T102 and T104 is a node N2. The capacitor C101 is provided between the nodes N1 and N2. The node N2 is connected to an output terminal OUT.

Next, the following description explains an operation of the semiconductor device 100. FIG. 47 is a timing chart showing waveforms of various signals of the semiconductor device 100.

When an input signal IN switches to a high level, the transistor T101 is turned on, and an electric potential at the node N1 increases to "VDD−Vth (where Vth is a threshold voltage of the transistor T101)" (pre-charge operation). As the electric potential at the node N1 increases, the transistor T102 is turned on. Here, in a case where a clock signal φ is being at a low level, a signal being at the low level is outputted from the output terminal OUT. Once an electric charge is pre-charged, the electric potential at the node N1 is retained until the STOP signal turns into an active state (high level) (floating state). If the clock signal φ switches to the high level in this floating state, the electric potential at the node N1 is boosted by an electric potential of α to "VDD−Vth+α" due to the capacitor C101 (bootstrap operation). During a period of time in which this electric potential is being greater than "VDD+Vth", a signal having an electric potential level of VDD is outputted from the output terminal OUT.

Then, when the STOP signal switches to the high level, the electric potential at the node N1 is discharged to VSS by the transistor T103, so that the transistor T102 is turned off. The transistor T104 is turned on, so that a signal having an electric potential level of VSS is outputted from the output terminal OUT.

Thus, with the arrangement of the conventional semiconductor device, it is possible to output a signal having a high electric potential, with a simple circuit arrangement by taking advantage of the bootstrap operation. Therefore, it is possible to use such a semiconductor device suitably in sections in a liquid crystal display device.

CITATION LIST

Patent Literature 1
Japanese Patent No. 3092506 B (Registration Date: Jul. 28, 2000)

SUMMARY OF INVENTION

However, a conventional semiconductor device constituted by transistors of the same conductivity type, like the one described above, has such a problem that an electric potential of an output signal gradually decreases due to an off-leakage current (a minute current leaked from a transistor while the transistor is in an off-state) or the like. Further, such a decrease in electric potential causes the output signal to have a high impedance, so that the output signal becomes vulnerable to noise. This results in a false operation in a subsequent circuit which receives the output signal. Specifically, for example, in a case where the semiconductor device is used as a scan signal line selection circuit of a shift resister provided in a liquid crystal display device, there is a risk that the output signal becomes vulnerable to noise, thereby resulting in such a false operation that a sequential selection operation of scan signal lines is not carried out accurately.

Here, the following description explains how the output signal becomes vulnerable to noise due to a decrease in its electric potential in the conventional semiconductor device. FIG. 47 shows a waveform of the output signal affected by the off-leakage current or the like, which waveform is shown by dotted lines.

For example, in the semiconductor device 100, the electric charge pre-charged at the node N1 is discharged due to an influence of an off-leakage current of the transistor T103, or the like, so that the electric potential at the node N1 gradually decreases (see the dotted line of the node N1 in FIG. 47). Then, in a case where the electric potential at the node N1 decreases to "VDD+Vth" while the clock signal φ is being at the high level (VDD), the transistor T102 is turned off. This causes the output signal of the transistor T102 to have a high impedance, so that an output signal OUT becomes vulnerable to noise.

Moreover, if the electric potential at the node N1 further decreases to lower than VDD, since the transistor T102 is in the off-state, an electric potential level of the output signal OUT itself decreases due to, for example, an off-leakage current of the transistor T104, or the like, as shown by a dotted line in FIG. 47. This might result in a false operation in the subsequent circuit.

As described above, the electric potential at the node N1 decreases due to the off-leakage current or the like. For this reason, for example, in a case where the clock signal ϕ is low in frequency, or in a case where a period of time for retaining the electric charge at the node N1 is long, the electric potential at the node N1 would decrease more greatly. Because of this, the output signal has a high impedance, thereby becoming vulnerable to noise.

The present invention is made in view of the problems. An object of the present invention is to provide: a semiconductor device constituted by transistors of the same conductivity type, which semiconductor device can output a stable signal by preventing a decrease in electric potential level of the signal; and a display device including the semiconductor device.

In order to attain the object, a semiconductor device of the present invention is constituted by a plurality of transistors of a same conductivity type, the semiconductor device including: among the plurality of transistors, a first transistor including a first terminal for receiving an on-voltage, a second terminal, and a control terminal for receiving an input signal; among the plurality of transistors, a second transistor including a first terminal for receiving an on-voltage, a second terminal connected to an output terminal, and a control terminal connected to the second terminal of the first transistor; and a capacitor provided between a connection point between the first transistor and the second transistor, and a clock terminal for receiving a clock signal, the clock signal having a frequency higher than a frequency of an output signal outputted from the output terminal.

A transistor is a circuit including a first terminal, a second terminal, and a control terminal. When the control terminal is supplied with a control signal, the first terminal and the second terminal are electrically connected to each other. Therefore, the circuit outputs a signal having a desired electric potential level through the first and second terminals. The control signal here has a voltage (signal level: VDD) for turning on the transistor when the control signal is inputted into the control terminal, and a voltage (signal level: VSS) for turning off the transistor when the control signal is inputted into the control terminal.

Here, as described above, in the conventional semiconductor device, an electric potential at a node connected to the control terminal of the transistor for outputting the signal having a desired electric potential level, in general, gradually decreases due to an off-leakage current or the like.

In view of this problem, the semiconductor device of the present invention has such an arrangement that, a clock signal having a frequency higher than that of the output signal is inputted, via the capacitor, into the node connected to the control terminal of the transistor for outputting the signal having a desired electric potential level, i.e. the connection point (node) between the first and second transistors.

With this arrangement, the electric potential at the node is boosted by an electric potential of α by the clock signal and the capacitor, and then, for example, decreases by an electric potential of β to "VDD−Vth+α−β (where Vth is a threshold voltage of the first transistor)" due to the off-leakage current or the like. After that, when the clock signal switches to a low level (VSS), the electric potential at the node decreases to "VDD−Vth−β". However, here, in a case where the input signal is being at a high level (VDD), the electric potential at the node is charged to "VDD−Vth". Then, when the clock signal switches to the high level again, the electric potential at the node is boosted again to "VDD−Vth+α".

Thus, with the arrangement of the semiconductor device, the boosting operation is carried out in accordance with a cycle of the clock signal having a frequency higher than that of the output signal. Therefore, even if the electric potential at the node decreases due to the off-leakage current or the like, the electric potential can be immediately charged back by the boosting operation. This allows the electric potential at the node to be increased with a period shorter than that of the conventional arrangement. Therefore, it is possible to stabilize: the electric potential level of the output signal; and an operation of a subsequent circuit that receives the output signal.

Further, by setting an amplitude of the clock signal, and the capacitor so that the boosted electric potential (VDD−Vth+α) at the node is not less than "VDD+Vth (where Vth is a threshold voltage of the second transistor)", it becomes possible to retain the electric level of the output signal at VDD.

Furthermore, since the signal having a high electric potential is inputted into the control terminal of the second transistor, the output signal can have a low impedance, and can be stable against noise.

The semiconductor device of the present invention preferably further includes: among the plurality of transistors, a third transistor including a first terminal connected to the connection point, a second terminal for receiving an off-voltage, and a control terminal for receiving a control signal.

With the arrangement, in a case where the third transistor is turned on by the control signal, the electric potential at the node can be successfully reduced to VSS.

The semiconductor device of the present invention preferably further includes: among the plurality of transistors, a fourth transistor including a first terminal connected to the output terminal, a second terminal for receiving an off-voltage, and a control terminal for receiving the control signal.

With the arrangement, in a case where the third and fourth transistors are turned on by the control signal, the electric potential at the node can be successfully reduced to VSS, and simultaneously the electric potential level of the output signal can be stabilized at the low level (off voltage: VSS).

The semiconductor device of the present invention preferably further includes: among the plurality of transistors, a fifth transistor including a first terminal for receiving an on-voltage, a second terminal connected to the connection point, and a control terminal connected to the output terminal.

With the arrangement, the output signal is inputted into the control terminal of the fifth transistor. Therefore, even if the electric potential at the node decreases due to the off-leakage current or the like under a condition that the input signal is being at the low level and the first transistor is in the off-state, the electric potential at the node can be charged again to "VDD−Vth" during a period of time in which the output signal is being at the high level (on voltage: VDD).

Because of this, the electric potential at the node can be boosted to "VDD−Vth+α" during the period of time in which the clock signal is being at the high level. Therefore, it becomes possible to more successfully stabilize the electric potential level of the output signal.

The semiconductor device of the present invention preferably further includes: among the plurality of transistors, a sixth transistor which outputs the input signal, the sixth transistor including: a first terminal connected to an input terminal; a second terminal connected to the control terminal of the first transistor, and the output terminal; and a control terminal for receiving an enable signal.

With the arrangement, once the enable signal switches to the high level, regardless of whether or not the enable signal switches to the low level later, it is possible to keep inputting a signal being at the high level into the control terminal of the first transistor during a period of time in which the output signal is being at the high level. Therefore, it is possible to stably retain the active state of the semiconductor device.

The semiconductor device of the present invention preferably further includes: among the plurality of transistors, a seventh transistor including a first terminal connected to the connection point, a second terminal for receiving the off-voltage, and a control terminal for receiving an initialization signal for stabilizing an initial state of the semiconductor device.

With the arrangement, the initialization signal being at the high level is inputted into the seventh transistor in the initial state, so that the electric potential at the node can be stabilized at VSS. Therefore, it is possible to stabilize the initial state.

The semiconductor device of the present invention preferably further includes: among the plurality of transistors, an eighth transistor including a first terminal connected to the clock terminal, a second terminal connected to an end of the capacitor, and a control terminal for receiving the input signal.

With the arrangement, by controlling the on/off state of the eighth transistor, it is possible to electrically separate the clock terminal, and the capacitor connected to the node from each other. This can cause the load of the clock terminal to be a parasitic capacitance of the eighth transistor only. Therefore, it is possible to have a reduction in electric power consumption by a decrease in required driving capability of the circuit for driving the clock terminal, and a cut-down in capacitance.

In order to attain the object, the semiconductor device of the present invention is constituted by a plurality of transistors of a same conductivity type, the semiconductor device including: among the plurality of transistors, a first transistor including a first terminal for receiving an on-voltage, a second terminal, and a control terminal for receiving an input signal; among the plurality of transistors, a second transistor including a first terminal for receiving an on-voltage, a second terminal connected to an output terminal, and a control terminal connected to the second terminal of the first transistor; a capacitor provided between a connection point between the first transistor and the second transistor, and a clock terminal for receiving a clock signal; among the plurality of transistors, a tenth transistor including a first terminal connected to the connection point, a second terminal, and a control terminal for receiving an on-voltage; and among the plurality of transistors, a third transistor including a first terminal connected to the second terminal of the tenth transistor, a second terminal for receiving an off-voltage, and a control terminal for receiving a control signal, the clock signal having a frequency higher than a frequency of an output signal outputted from the output terminal.

The electric potential at the node is boosted by the clock signal, so that a high voltage is applied to each of the transistors connected to the node. Therefore, there is a risk that such a transistor is broken due to a voltage higher than its withstand voltage.

The semiconductor device described above includes the tenth transistor between the node and the third transistor. This can reduce the electric potential at the third transistor, for example (details of this effect is described later). Therefore, it is possible to constitute a highly-reliable circuit.

In the semiconductor device of the present invention, the clock signal preferably shows such a waveform that a high level and a low level are repeated alternatively and periodically, the clock signal being set so that a period of time of the low level in one cycle is equivalent to a period of time from a time that the clock signal switches from the high level to the low level, to a time that an electric potential at the connection point is saturated.

This can reduce the impedance of the output signal while keeping the active state of the semiconductor device.

A display device of the present invention includes any one of the semiconductor devices described above.

Therefore, it is possible to provide a display device which can output a stable signal by preventing a decrease in electric potential level.

Note that the display device of the present invention is preferably a liquid crystal display device.

Additional objects, features, and strengths of the present invention will be made clear by the description below. Further, the advantages of the present invention will be evident from the following explanation in reference to the drawings.

BRIEF DESCRIPTION OF DRAWINGS

FIG. 3 is a timing chart showing waveforms of various signals of the circuit illustrated in FIG. 1 in a case where the circuit is influenced by an off-leakage current or the like.

FIG. 4 is a timing chart showing waveforms of various signals of a conventional circuit in a case where the circuit is influenced by an off-leakage current or the like.

REFERENCE SIGNS LIST

1. Memory circuit
2, 3, 4 Buffer circuit
5. Unit circuit (of shift resister)
10, 20, 30, 40, 50, 60, 70. Circuit (semiconductor device)
11, 21, 31, 41, 51, 61, 71. Circuit (semiconductor device)
T1. Transistor (first transistor)
T2. Transistor (second transistor)
T3. Transistor (third transistor)
T4. Transistor (fourth transistor)
T5. Transistor (fifth transistor)
T6. Transistor (sixth transistor)
T7. Transistor (seventh transistor)
T8. Transistor (eighth transistor)
T9. Transistor (ninth transistor)
T10. Transistor (tenth transistor)
151. Liquid crystal display device (display device)
n1, n2, n3, n4, n5, n6. Node
100. Semiconductor device

DESCRIPTION OF EMBODIMENTS

Embodiments of the present invention are described below with reference to FIGS. 1 through 45.

An active signal retaining circuit (hereinafter, this circuit is referred to as "circuit" for the sake of simple explanation), corresponding to a semiconductor device of the present invention, is constituted by transistors of a same conductivity type, i.e. unipolar-channel-type transistors (n-channel-type or p-channel-type transistors). In each of the embodiments described below, the n-channel-type transistors are used as an example. An arrangement employing the p-channel-type transistors is mentioned only at the end of the Description of Embodiments, and detailed explanations of such an arrangement is omitted in the present specification. The unipolar-channel-type transistor may be a TFT, or a field-effect transistor in a form of a silicon substrate.

Embodiment 1

Figure 1:
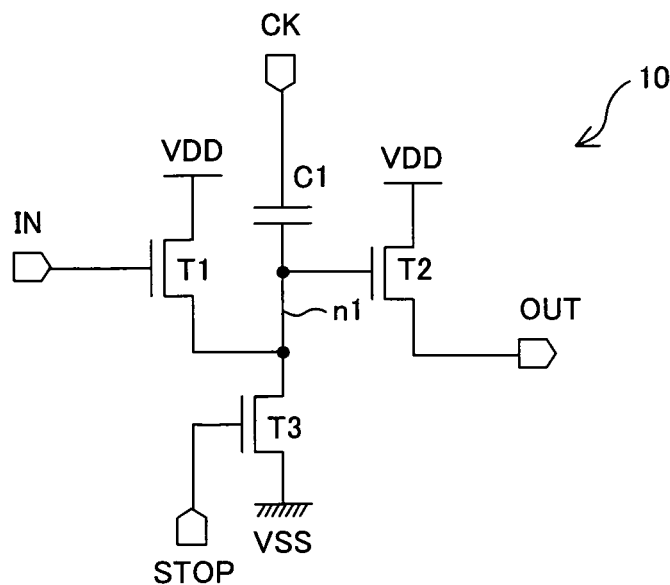
FIG. 1 is a circuit diagram illustrating an arrangement of a circuit in accordance with Embodiment 1 of the present invention.
Figure 2:
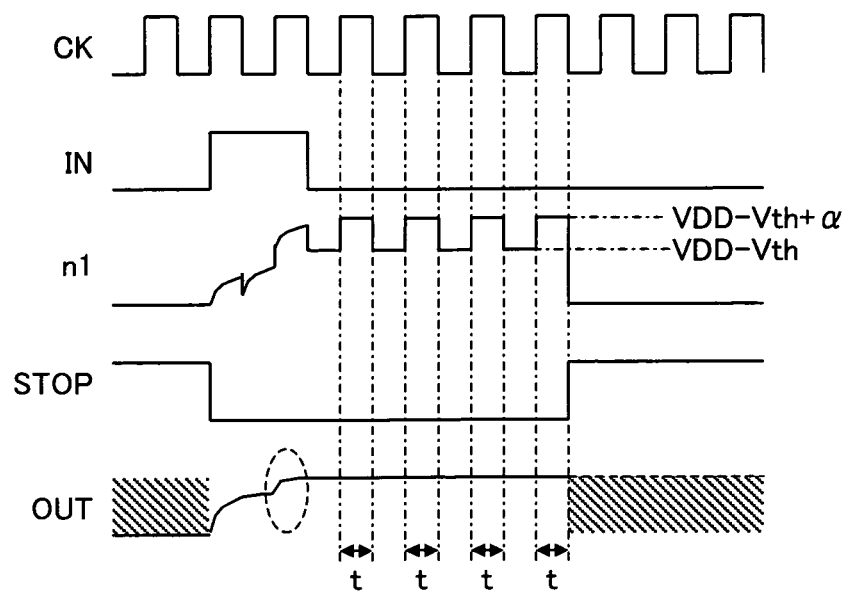
FIG. 2 is a timing chart showing waveforms of various signals of the circuit illustrated in FIG. 1.

The following description explains an arrangement of a circuit 10 of the present embodiment. FIG. 1 is a circuit diagram illustrating the arrangement of the circuit 10, and FIG. 2 is a timing chart showing waveforms of various signals of the circuit 10.

The circuit 10 includes: a transistor T1 (first transistor); a transistor T2 (second transistor); a transistor T3 (third transistor); and a capacitor C1. Into one end of the capacitor C1, a clock signal CK having a frequency higher than that of an output signal OUT of the circuit 10 is inputted. Hereinafter, a voltage (signal level) which turns on a transistor when being applied to a gate terminal (control terminal) is referred to as "on-voltage (on-level)", and a voltage (signal level) which turns off the transistor when being applied to the gate terminal is referred to as "off-voltage (off-level)". For the n-channel-type transistor, the on-voltage is a high voltage (the on-level is a high level), and the off-voltage is a low voltage (the off-level is a low level). On the other hand, for the p-channel-type transistor, the on-voltage is the low voltage, and the off-voltage is the high voltage.

As illustrated in FIG. 1, the transistor T1 is arranged such that its drain terminal (first terminal) is connected to a power supply VDD, and its gate terminal (control terminal) is connected to an input terminal IN. The transistor T2 is arranged such that (i) its drain terminal (first terminal) is connected to the power supply VDD, (ii) its gate terminal (control terminal) is connected to a source terminal of the transistor T1, and (iii) its source terminal (second terminal) is connected to an output terminal OUT. The transistor T3 is arranged such that its drain terminal (first terminal) is connected to: the source terminal of the transistor T1; the gate terminal of the transistor T2; and a clock terminal CK via the capacitor C1. A connection point between the transistors T1, T2, and T3, and the capacitor C1 is a node n1.

Figure 46:
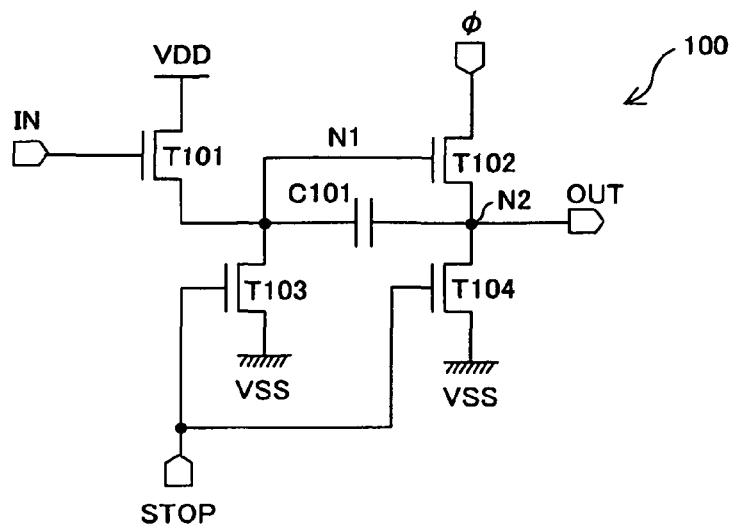
FIG. 46 is a circuit diagram illustrating an arrangement of a conventional semiconductor device.
Figure 47:
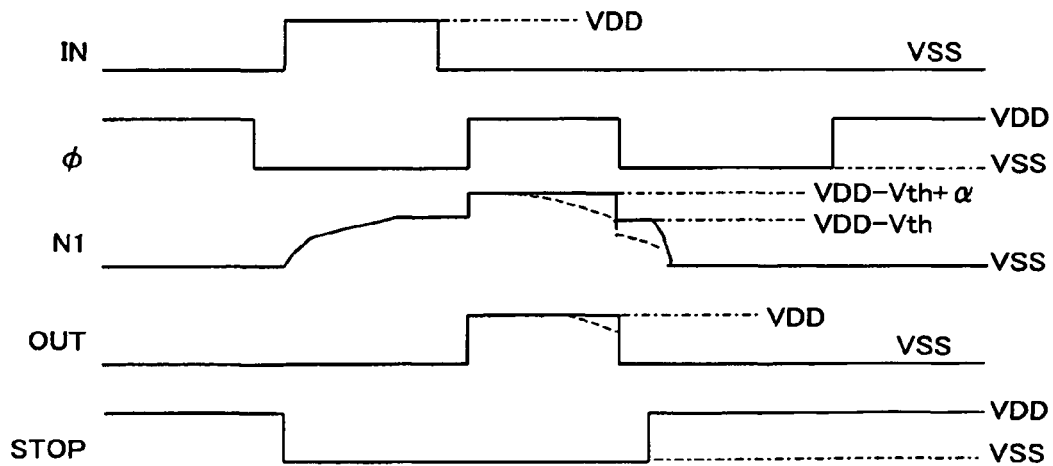
FIG. 47 is a timing chart showing waveforms of various signals of the semiconductor device illustrated in FIG. 46.

That is, unlike a conventional circuit (semiconductor circuit 100) illustrated in FIG. 46, the circuit 10 of the present embodiment has such an arrangement that the clock signal CK having a frequency higher than that of the output signal OUT is inputted into one end of the capacitor C1, and the other end of the capacitor C1 is connected to the node n1 which retains a high level signal in a floating state. With this arrangement, it becomes possible to retain an electric potential level, so as to output a stable signal which is hardly affected by noise. The following description specifically explains this effect along with an operation of the circuit 10, with reference to FIG. 2. Note that signals inside the circuit 10, the input signal, and the output signal have an electric potential of VDD when being at the high level, and have an electric potential of VSS (zero) when being at the low level, unless otherwise noted.

When the input signal IN switches to the high level (VDD), the transistor T1 is turned on, and an electric potential at the node n1 increases to "VDD−Vth (where a Vth is a threshold voltage of the transistor T1)" (pre-charge operation). As the electric potential at the node n1 increases, the transistor T2 is turned on. When the input signal IN switches from the high level to the low level (VSS), the node n1 turns into the floating state while retaining a high level electric charge. In this state, if the clock signal CK switches to the high level, the electric potential at the node n1 is boosted by an electric potential of α to "VDD−Vth+α" due to the clock signal CK. In a case where this electric potential exceeds "VDD+Vth", the transistor T2 outputs VDD to the output terminal OUT.

As described above, a signal having a high electric potential is inputted into the gate terminal of the transistor T2 while the electric potential at the node n1 is being boosted by the clock signal Ck. Therefore, the transistor T2 outputs a signal having an electric potential level of VDD to the output terminal OUT, and simultaneously, an output impedance decreases (t period in FIG. 2).

After that, when a STOP signal switches to the high level, the transistor T3 is turned on, so that the electric charge at the node n1 is discharged. As a result, the transistor T2 is turned off. This causes the output terminal OUT to be in the floating state (see regions indicated by oblique lines in FIG. 2).

Thus, during a period of time until the STOP signal switches to the high level, the output terminal OUT normally outputs VDD until the electric potential at the node n1, boosted by the clock signal CK, decreases to lower than "VDD+Vth" due to an off-leakage current of the transistor T3 or the like.

Further, as shown in FIG. 2, the electric potential at the node n1 is increased by the boosting operation by the clock signal CK when the input signal IN being at the high level is inputted and the node n1 is pre-charged. Therefore, the output signal OUT rises quickly (see a region surrounded by a dotted line), thereby resulting in a faster driving speed.

Figure 3:
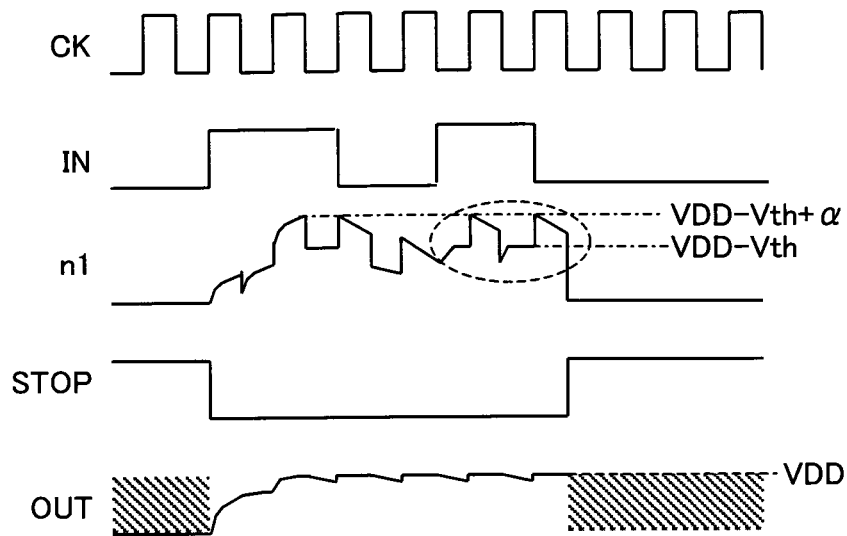
Figure 4:
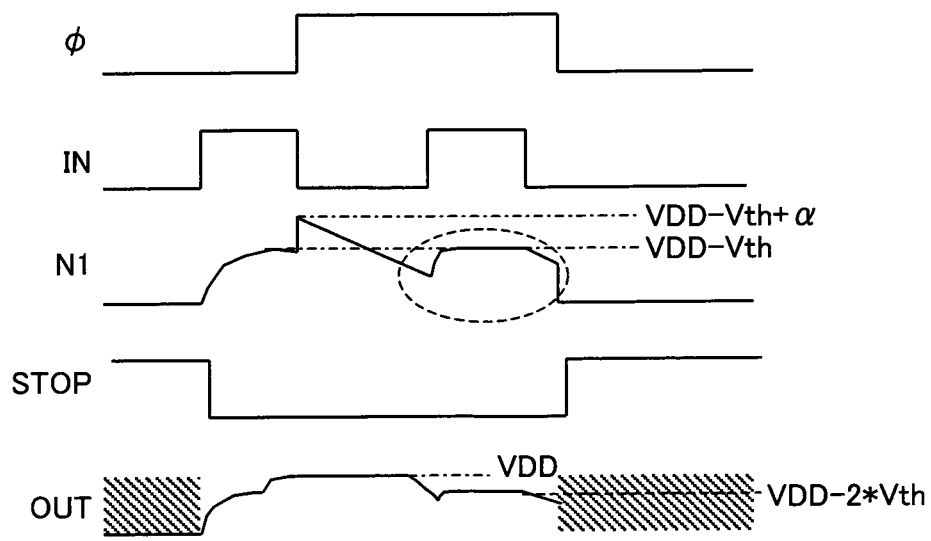

Here, the following description explains an operation of the circuit 10 in a case where the circuit 10 is influenced by the off-leakage current or the like, in comparison with an arrangement of a conventional circuit. FIG. 3 is a timing chart showing waveforms of various signals of the circuit 10, in a case where the circuit 10 is influenced by the off-leakage current or the like. FIG. 4 is a timing chart showing waveforms of various signals of a conventional circuit illustrated in FIG. 46 in a case where the conventional circuit is influenced by the off-leakage current or the like.

In the conventional circuit illustrated in FIG. 46, in a case where a node N1 has a leakage path, an electric potential at the node N1 gradually decreases during a period of time in which a clock signal φ is being at the high level. Here, in a case where the electric potential at the node N1 decreases to "VDD−Vth" or less due to a leakage, the electric potential at the node N1 is charged only up to "VDD−Vth" (see a region surrounded by a dotted line in FIG. 4) even if the input signal IN switches to the high level again. Therefore, the output signal OUT has a high impedance, thereby becoming vulnerable to noise. Further, in a case where the output signal OUT has a leakage, the electric potential at a node N2 increases only up to "VDD−2×Vth" even if the node N2 is recharged. For this reason, an operating margin of a subsequent circuit connected to the output terminal OUT decreases.

On the other hand, in the circuit 10 of the present embodiment, if the electric potential at the node n1 is boosted by the clock signal CK, and then is decreased by an electric potential of β due to a leakage, the electric potential at the node n1 becomes "VDD−Vth+α−β". Then, when the clock signal CK switches to the low level, the electric potential at the node n1 decreases to "VDD−Vth−β". However, at this point, if the input signal IN is at the high level, the electric potential of the node n1 is charged to "VDD−Vth". Therefore, when the clock signal CK switches to the high level again, the electric potential at the node n1 is boosted to "VDD−Vth+α" (see a region surrounded by a dotted line in FIG. 3). Because of this, it is possible to stably retain the electric potential of VDD even if the output signal OUT has a leakage or the like. Accordingly, the subsequent circuit connected to the output signal OUT can stably operate. Further, since a signal having a high electric potential is inputted into the gate terminal of the transistor T2, the output signal OUT can retain a low impedance, and can be stable against noise.

Thus, with the arrangement of the circuit 10 of the present embodiment, it is possible to charge the electric potential at the node n1 to "VDD−Vth" again even if the output signal OUT has a leakage or the like. Since the frequency of the clock signal CK is set to be higher than that of the output signal, it is possible to boost again, by the boosting operation by the clock signal CK, the electric potential at the node n1 to "VDD+Vth" or more before the STOP signal switches to the high level. For this reason, it is possible to secure, longer than the conventional circuit, (i) a period of time in which VDD can be outputted, and (ii) a period of time of a low impedance.

Here, an amplitude of the clock signal CK, and the capacitor C1 are set so that the boosted electric potential (VDD−Vth+α) at the node n1 is "VDD+Vth" or more.

Figure 5:
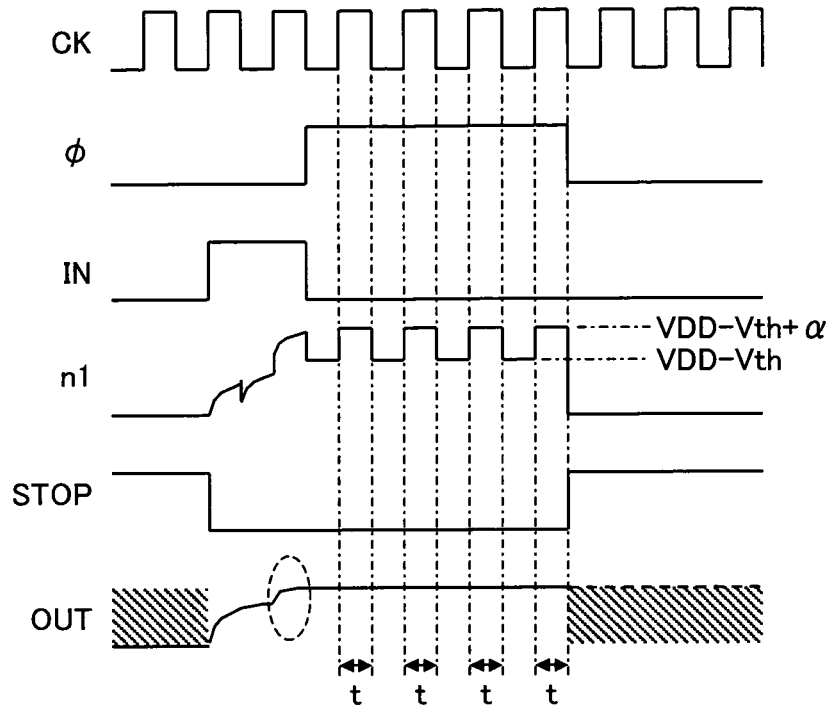
FIG. 5 is a timing chart showing waveforms of various signals of the circuit illustrated in FIG. 1 in a case where a clock signal φ is inputted into a drain terminal of a transistor T2.

In the arrangement of the circuit 10 illustrated in FIG. 1, the drain terminal of the transistor T2 is connected to the power supply VDD. It should be noted that the present invention is not limited to this arrangement. For example, the clock signal φ may be inputted into the drain terminal. FIG. 5 is a timing chart showing waveforms of various signals of the circuit 10 having the arrangement in which the clock signal φ is inputted into the drain terminal of the transistor T2. In this arrangement, it is also possible to output the signal inputted into the transistor T2 while retaining the electric potential level of the signal, in the similar manner to the arrangement of the circuit 10 illustrated in FIG. 1. Therefore, when the transistor T2 is turned on, the electric potential level equivalent to the clock signal φ is outputted.

Embodiment 2

Figure 6:
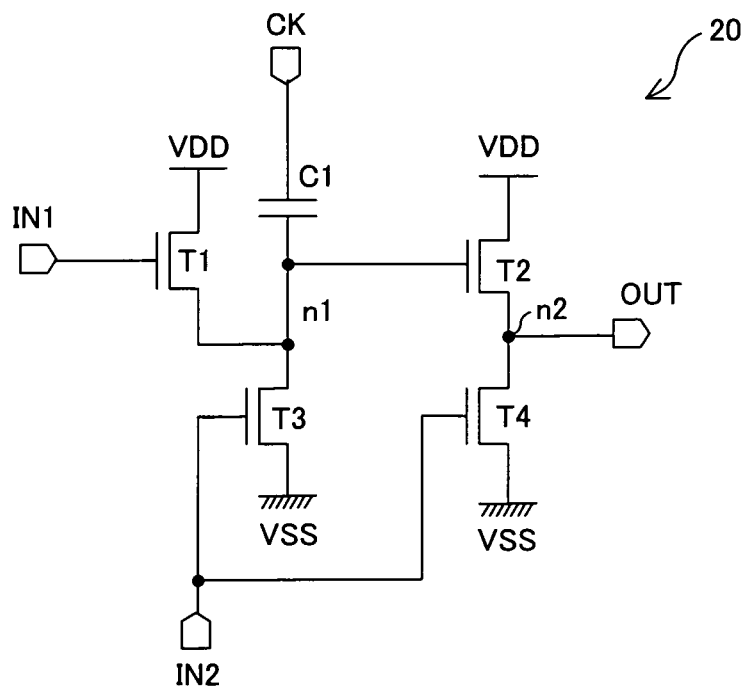
FIG. 6 is a circuit diagram illustrating an arrangement of a circuit in accordance with Embodiment 2 of the present invention.
Figure 7:
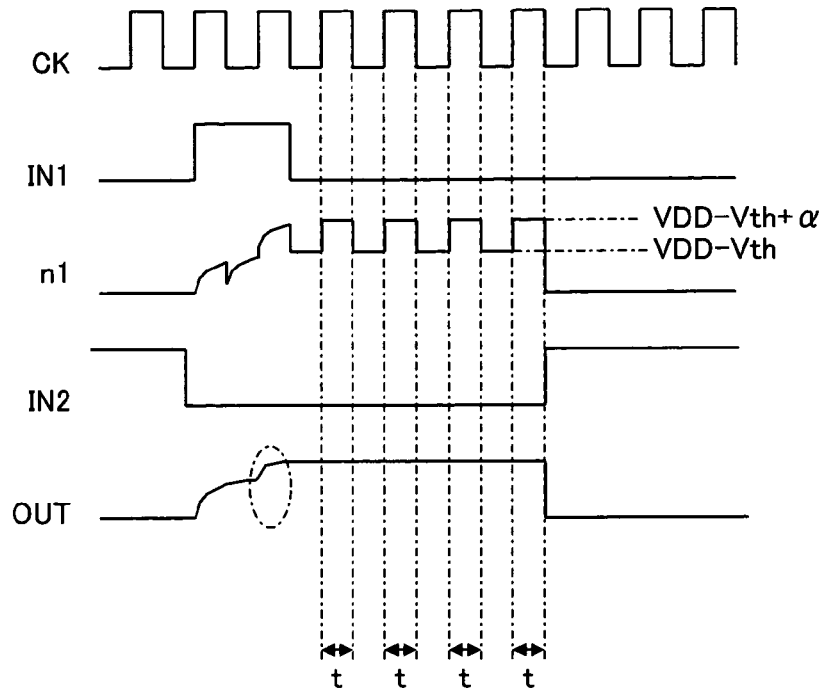
FIG. 7 is a timing chart showing waveforms of various signals of the circuit illustrated in FIG. 6.

The following description explains an arrangement of a circuit 20 of the present embodiment. FIG. 6 is a circuit diagram illustrating the arrangement of the circuit 20, and FIG. 7 is a timing chart showing waveforms of various signals of the circuit 20. Note that as to members having the same functions as those of the members described in Embodiment 1, the same reference signs are used and explanations of these members are omitted here for the sake of simple explanation. Further, the terms defined in Embodiment 1 are also used in the present embodiment, as defined in Embodiment 1, unless otherwise noted.

Here, with the arrangement (see FIG. 1) of the circuit 10 described in Embodiment 1, at timing when the STOP signal switches to the high level and the electric potential at the node n1 becomes the low level, the output terminal OUT turns into the floating state (see the regions indicated by the oblique lines in FIG. 2). This causes the output signal to be vulnerable to noise.

In order to eliminate this floating state, the circuit 20 of the present embodiment has such an arrangement that the circuit 10 further includes a transistor T4 (fourth transistor). As illustrated in FIG. 6, the transistor T4 is arranged such that (i) its drain terminal (first terminal) is connected to the source terminal of the transistor T2 and the output terminal OUT, (ii) its source terminal (second terminal) is connected to the power supply VSS, and (iii) its gate terminal (control terminal) is connected to the gate terminal of the transistor T3. The gate terminals of the transistors T3 and T4 are connected to an input terminal IN2. An input signal IN2 for controlling an on/off state of each of the transistors T3 and T4 is inputted into each of the gate terminals. A connection point between the transistor T2, the transistor T4, and the output terminal OUT is a node n2.

With the arrangement, as shown in FIG. 7, at timing when the electric potential at the node n1 becomes the low level, the input signal IN2 being at the high level is inputted so that the transistors T3 and T4 are turned on. Therefore, the electric charge at the node n1 can be successfully discharged, and simultaneously the electric potential level of the output signal OUT can be stabilized at the low level (VSS).

Note that the signal inputted into the gate terminal of the transistor T4 is not particularly limited, and may be another control signal, as long as the signal can stabilize the electric potential level of the output signal OUT at the low level (VSS).

Embodiment 3

Figure 8:
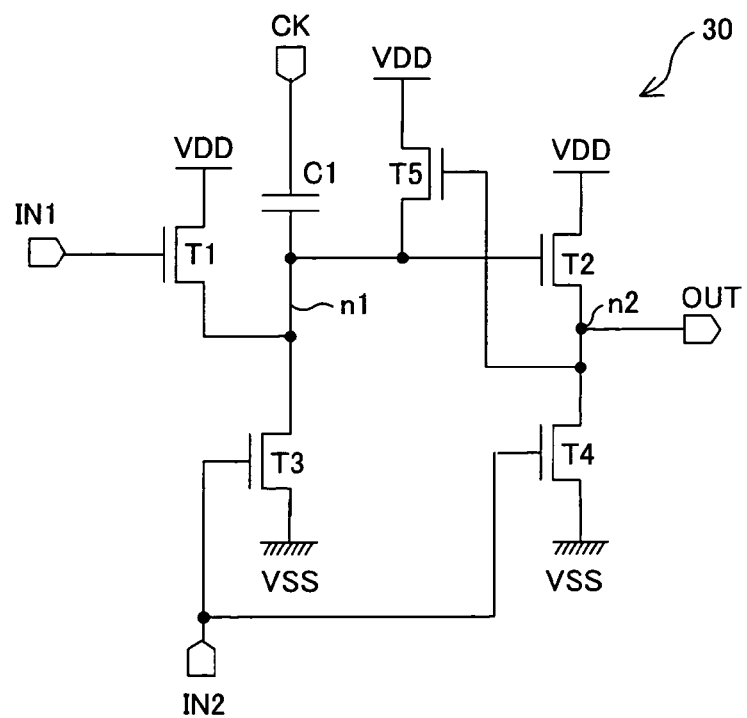
FIG. 8 is a circuit diagram illustrating an arrangement of a circuit in accordance with Embodiment 3 of the present invention.

The following description explains an arrangement of a circuit 30 of the present embodiment. FIG. 8 is a circuit diagram illustrating the arrangement of the circuit 30. Note that as to members having the same functions as those of the members described in Embodiments 1 and 2, the same reference signs are used and explanations of these are omitted here for the sake of simple explanation. Further, the terms defined in Embodiments 1 and 2 are also used in the present embodiment, as defined in Embodiments 1 and 2, if not otherwise specified.

The circuit 30 of the present embodiment has such an arrangement that the circuit 20 illustrated in FIG. 6 further includes a transistor T5 (fifth transistor) which plays a role of a refresh function. As illustrated in FIG. 8, the transistor T5 is arranged such that (i) its drain terminal (first terminal) is connected to the power supply VDD, (ii) its source terminal (second terminal) is connected to the node n1, and (iii) its gate terminal (control terminal) is connected to the node n2.

With the arrangement, the output signal OUT is inputted into the gate terminal of the transistor T5. Therefore, even if the electric potential at the node n1 decreases due to an off-leakage current or the like under a condition that the input signal IN1 is at the low level and the transistor T1 is in the off-state, the electric potential at the node n1 can be charged again to "VDD−Vth" during a period of time in which the output signal OUT is being at the high level (refresh operation). Because of this, during a period of time in which the clock signal CK is being at the high level, the electric potential at the node n1 can be boosted to "VDD−Vth+α". Therefore, the output signal OUT can stably output VDD, and can normally operate without having a false operation during a low frequency operation period.

Embodiment 4

Figure 9:
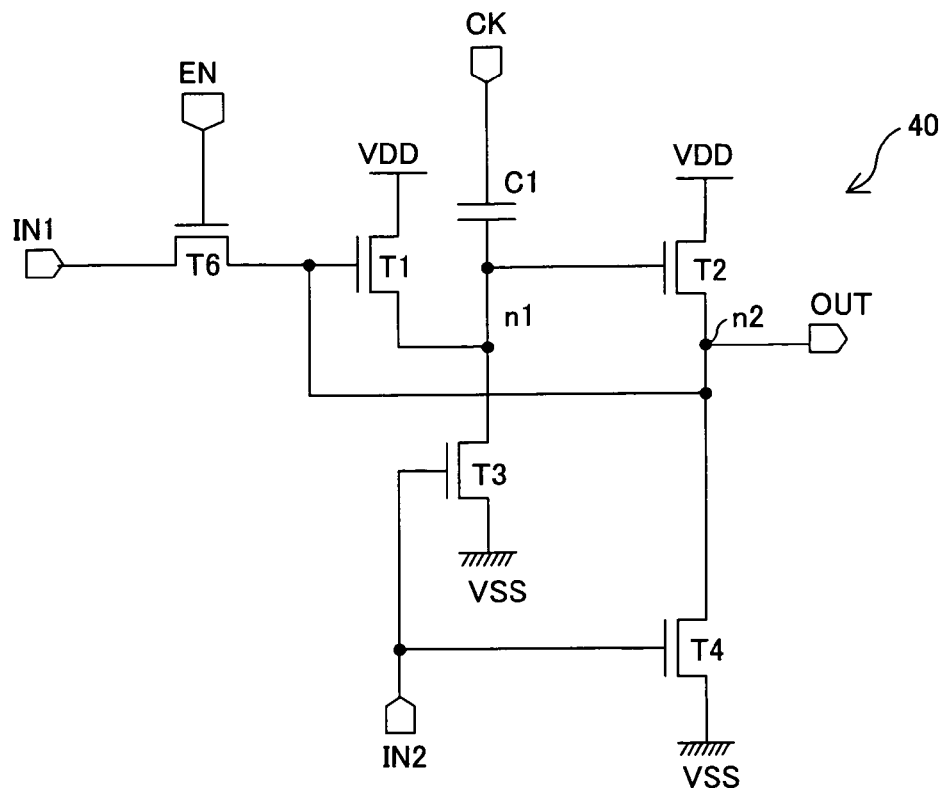
FIG. 9 is a circuit diagram illustrating an arrangement of a circuit in accordance with Embodiment 4 of the present invention.
Figure 10:
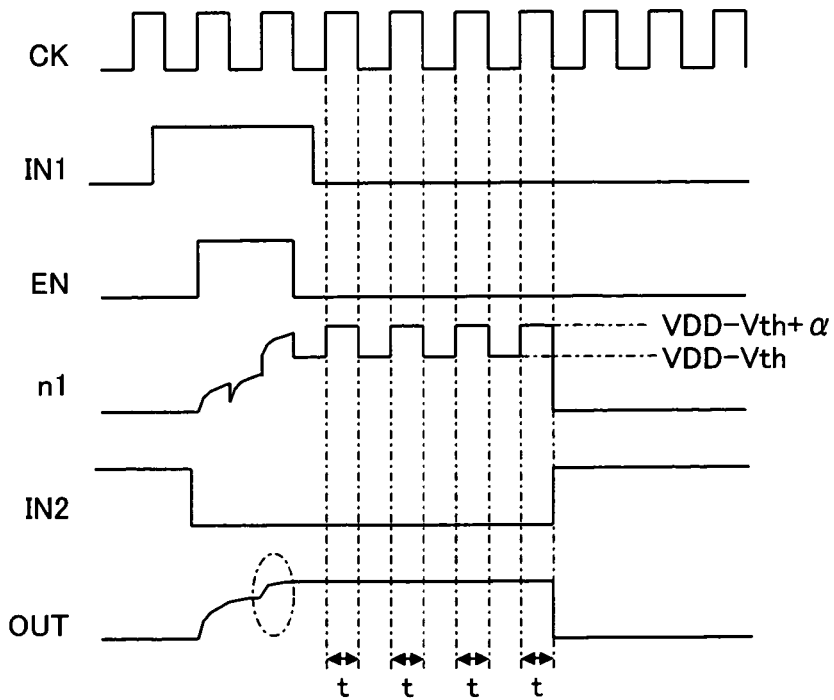
FIG. 10 is a timing chart showing waveforms of various signals of the circuit illustrated in FIG. 9.

The following description explains an arrangement of a circuit 40 of the present embodiment. FIG. 9 is a circuit diagram illustrating the arrangement of the circuit 40, and FIG. 10 is a timing chart showing waveforms of various signals of the circuit 40. Note that as to members having the same functions as those of the members described in Embodiments 1 through 3, the same reference signs are used and explanations of these are omitted here for the sake of simple explanation. Further, the terms defined in Embodiments 1 through 3 are also used in the present embodiment, as defined in Embodiments 1 through 3, if not otherwise specified.

The circuit 40 of the present embodiment has such an arrangement that the circuit 20 illustrated in FIG. 6 further includes a transistor T6 (sixth transistor) between the input terminal IN1 and the transistor T1. As illustrated in FIG. 9, the transistor T6 is arranged such that (i) its drain terminal (first terminal) is connected to the input terminal IN1, (ii) its source terminal (second terminal) is connected to the gate terminal of the transistor T1, and (iii) its gate terminal (control terminal) receives an enable signal EN. Further, the source terminal of the transistor T6 is also connected to the connection point (node n2) between the transistors T2 and T4.

With the arrangement, once the enable signal EN switches to the high level, regardless of whether or not the enable signal EN switches to the low level later, it is possible to keep inputting a signal being at the high level into the gate terminal of the transistor T1 during a period of time in which the output signal OUT is being at the high level. This makes it possible to keep the circuit 40 in an active state.

Further, the output terminal OUT and the gate terminal of the transistor T1 are connected to each other. Therefore, in a case where the electric potential at the node n1 decreases to "VDD−Vth" or less in a period of time in which the output signal OUT is being at the high level, the transistor T1 is turned on. Note that when the electric potential at the node n1 increases to "VDD−Vth" or more, the transistor T1 is turned off, and the node n1 turns into the floating state.

Because of this, even if the electric potential at the node n1 decreases due to the off-leakage current or the like, the electric potential at the node n1 can be charged again to "VDD−Vth" by the transistor T1 during the period of time in which the output signal OUT is being at the high level (refresh operation). Accordingly, during the period of time in which the clock signal CK is being at the high level, the electric potential at the node n1 can be boosted to "VDD−Vth+α". Therefore, the output signal OUT can stably output VDD, and can normally operate without having a false operation during a low frequency operation period.

Figure 11:
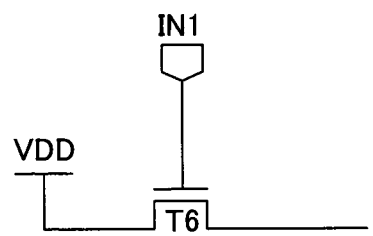
FIG. 11 is a circuit diagram illustrating another arrangement of a transistor T6 in the circuit illustrated in FIG. 9.
Figure 12:
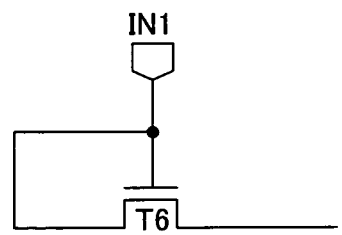
FIG. 12 is a circuit diagram illustrating still another arrangement of the transistor T6 in the circuit illustrated in FIG. 9.

Here, the transistor T6 is not limited to the aforementioned arrangement illustrated in FIG. 9. For example, the transistor T6 may be arranged such that its source terminal turns into the floating state when the input signal IN1 has the electric potential of the low level. FIGS. 11 and 12 specifically illustrate examples of such an arrangement. In the arrangement illustrated in FIG. 11, the drain terminal of the transistor T6 is connected to the power supply VDD, and the input signal IN1 is inputted into the gate terminal of the transistor T6. Further, in the arrangement illustrated in FIG. 12, the input signal IN1 is inputted into the drain terminal and the gate terminal of the transistor T6. These arrangements are suitable for an arrangement not employing another signal (enable signal EN, for example), in which once the input signal IN1 becomes active (high level), the active state is retained regardless of whether or not the input signal IN1 switches to the low level later.

Embodiment 5

Figure 13:
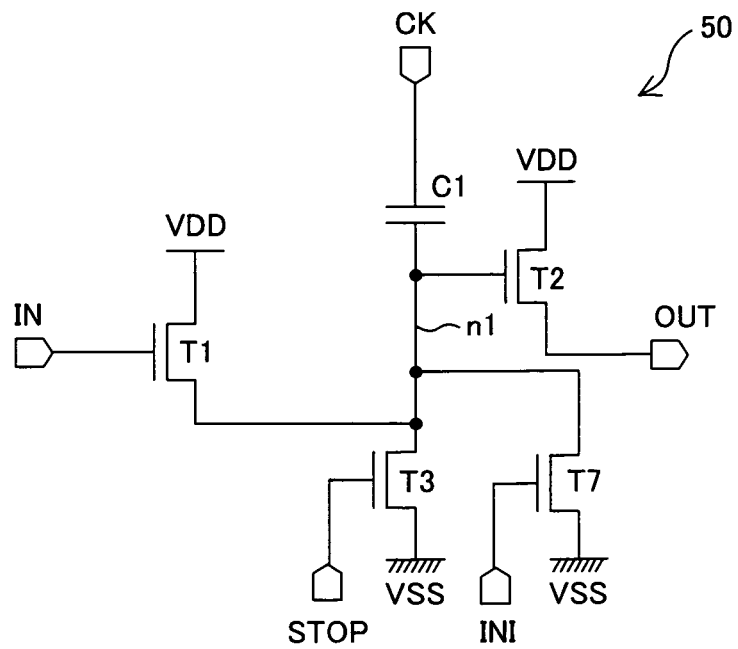
FIG. 13 is a circuit diagram illustrating an arrangement of a circuit in accordance with Embodiment 5 of the present invention.

The following description explains an arrangement of a circuit 50 of the present embodiment. FIG. 13 is a circuit diagram illustrating the arrangement of the circuit 50. Note that as to members having the same functions as those of the members described in Embodiments 1 through 4, the same reference signs are used and explanations of these are omitted here for the sake of simple explanation. Further, the terms defined in Embodiments 1 through 4 are also used in the present embodiment, as defined in Embodiments 1 through 4, if not otherwise specified.

Here, in the arrangements of the circuits described in Embodiments 1 through 4, in a case where the input signal IN is being at the low level at an initial state, an amount of the electric charge charged in the capacitor C1 is not found, and the electric potential at the node n1 is unstable. Therefore, these arrangements are unstable at the initial state.

In order to realize a stable initial state, the circuit 50 of the present embodiment has such an arrangement that any of the arrangements in accordance with Embodiments 1 through 4 further includes a transistor T7 (seventh transistor). The circuit 50 illustrated in FIG. 13 has such an arrangement that the circuit 10 illustrated in FIG. 1 includes the transistor T7. The transistor T7 is arranged such that (i) its gate terminal (control terminal) receives an initialization signal INI, (ii) its source terminal (second terminal) is connected to the power supply VSS, and (iii) its drain terminal (first terminal) is connected to the node n1.

With the arrangement, the initialization signal INI being at the high level is inputted at the initial state, so that the electric potential of the node n1 can be stabilized at the VSS. Therefore, it is possible to stabilize the initial state.

Note that it is possible to stabilize the initial state of any of the circuits in accordance with Embodiments 2 through 4 by providing the circuit with the transistor T7 in the same manner as described above.

Embodiment 6

Figure 14:
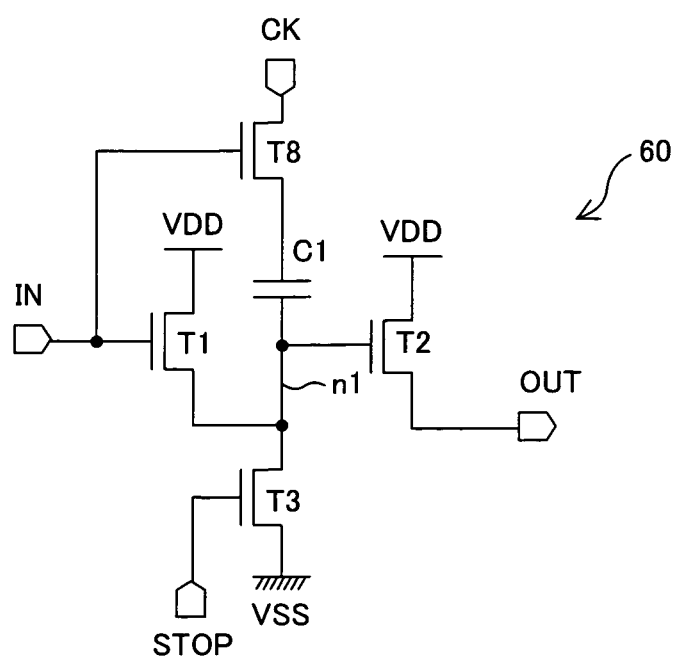
FIG. 14 is a circuit diagram illustrating an arrangement of a circuit in accordance with Embodiment 6 of the present invention.

The following description explains an arrangement of a circuit 60 of the present embodiment. FIG. 14 is a circuit diagram illustrating the arrangement of the circuit 60. Note that as to members having the same functions as those of the members described in Embodiments 1 through 5, the same reference signs are used and explanations of these are omitted here for the sake of simple explanation. Further, the terms defined in Embodiments 1 through 5 are also used in the present embodiment, as defined in Embodiments 1 through 5, if not otherwise specified.

Here, any of the arrangements of the circuits in accordance with Embodiments 1 through 5 has such a problem that a large capacitance of the clock terminal CK is required. The following description specifically explains a clock load with the circuit 10 illustrated in FIG. 1, as an example.

In a case where the electric potential at the node n1 is at the high level ("VDD−Vth" or more), that is, a period of time in which the node n1 is in the floating state, the capacitance of the clock terminal CK can be expressed by the following equality:

$$1/\text{capacitance of clock terminal } CK = 1/C1 + 1/Ctr \quad (1)$$
(where $Ctr$ is a sum of parasitic capacitances of the transistors $T1$, $T2$ and $T3$)

Note that a wire load and the like are omitted in the equality for the sake of simple explanation.

Here, in order to significantly boost the electric potential at the node n1, "C1>Ctr" is required. For example, for boosting a voltage of the node n1 by "2×Vp/3" with respect to an amplitude Vp of the clock signal CK, "C1: Ctr=2:1" is required. By substituting this equality into the equality (1), the following equality can be obtained:

$$\text{capacitance of clock terminal } CK = \tfrac{1}{3} \times C1$$

Next, in a case where the electric potential at the node n1 is at the low level (VSS), that is, a period of time in which the node n1 is not in the floating state, the capacitance of the clock terminal CK can be expressed by the following equality:

$$\text{capacitance of clock terminal } CK = C1$$

Thus, it is found that the capacitance of the clock terminal CK is large while the node n1 is not being in the floating state. Particularly, in a case where a plurality of the circuits, sequentially connected, receive the same clock signal CK via their clock terminals CK, the capacitance of the clock terminal CK becomes significantly large.

In order to reduce this clock load, the circuit 60 of the present embodiment has such an arrangement that any of the circuits in accordance with Embodiments 1 through 5 further includes a transistor T8 (eighth transistor). The circuit 60 illustrated in FIG. 14 has an arrangement that the circuit 10 illustrated in FIG. 1 includes the transistor T8. The transistor T8 is arranged such that (i) its gate terminal (control terminal) is connected to the input terminal IN, (ii) its drain terminal (first terminal) is connected to the clock terminal CK, and (iii) its source terminal (second terminal) is connected to the node n1 via the capacitor C1.

In the circuit 60, because of the transistor T8, it is possible to disconnect the clock terminal CK and the capacitor C1 from each other during a period of time in which the node n1 does not turn into the floating state and the load of the clock terminal CK becomes significantly large.

Specifically, in a case where the electric potential at the node n1 is stabilized at VSS, the node n1 does not need to be boosted by the clock signal CK. Therefore, by electrically separate the clock terminal CK and the capacitor C1 from each other by use of the transistor T8 during the period of time in which the electric potential of the node n1 is stabilized at VSS, the load of the clock terminal CK becomes only a parasitic capacitance of the transistor T8, which is significantly small.

Accordingly, with a reduction in required driving capability of the circuit for driving the clock terminal CK, and a reduction in capacitance of the clock terminal CK, it is possible to have a reduction in electric power consumption.

Figure 15:
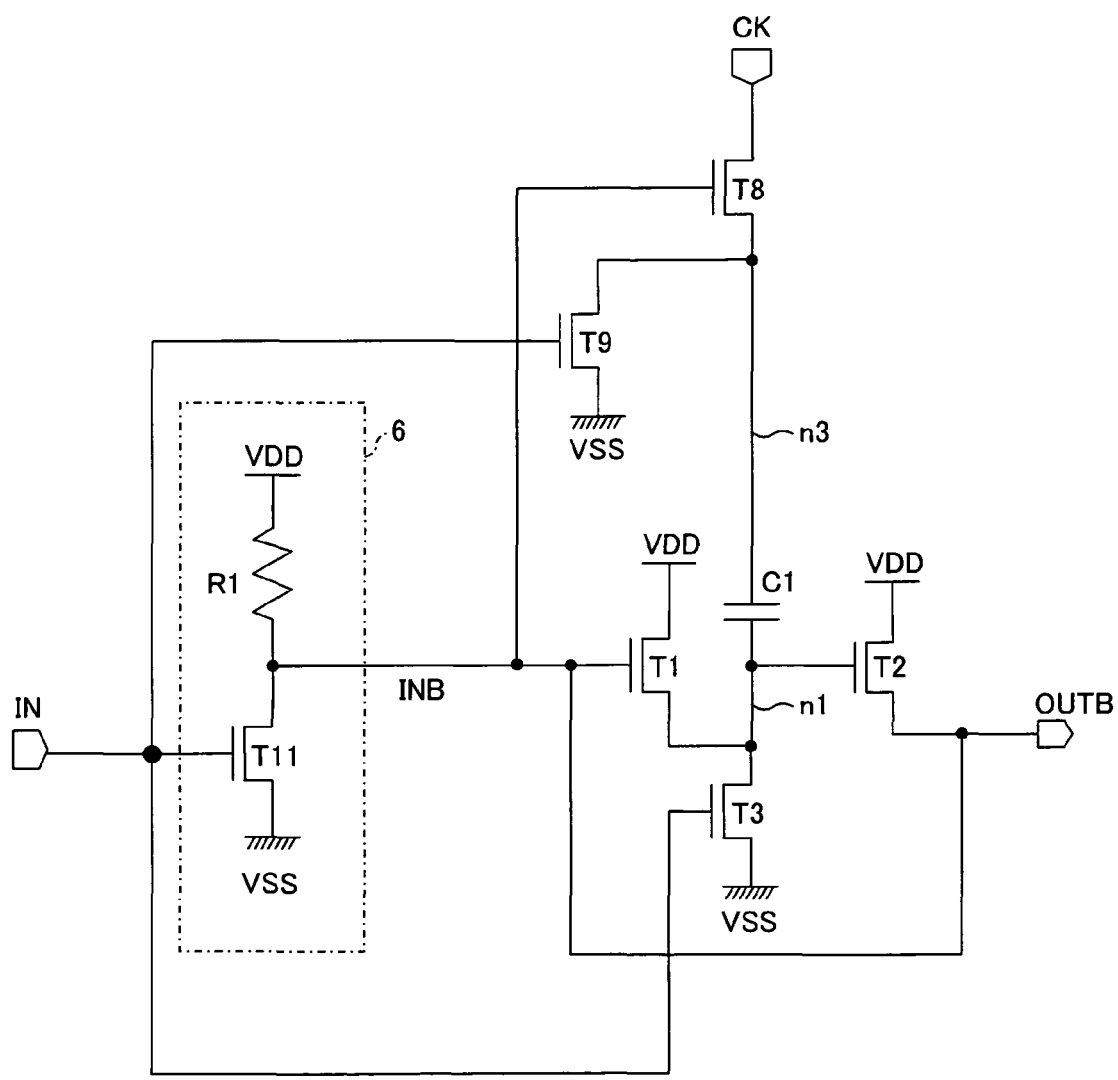
FIG. 15 is a circuit diagram illustrating another arrangement of the circuit illustrated in FIG. 14.

Here, in order to stabilize an electric potential at a node n3 provided between the transistor T8 and the capacitor C1 during a period of time in which the transistor T8 is in the off-state, the circuit 60 may further include a transistor T9, and an inverter 6 including a resistance R1 and a transistor T11, as illustrated in FIG. 15. In this arrangement, the transistor T9 is arranged such that (i) its drain terminal is connected to the node n3, (ii) its source terminal is connected to the power supply VSS, and (iii) its gate terminal is connected to the input terminal IN which is connected to the inverter 6. With this arrangement, in a case where the transistors T1 and T8 are turned off, the transistors T3 and T9 are turned on, so that the electric potentials at the node n1 and the node n3 can be stabilized at VSS.

Further, the gate terminal of the transistor T8 illustrated in FIG. 14 is connected to the input terminal IN. The signal inputted into the gate terminal of the transistor T8 is not particularly limited. It is possible to input, during a period of time in which the electric potential at the node n1 is stabilized at VSS, or during a part of such a period of time, another control signal for controlling the transistor T8 to be turned off.

Further, in FIG. 15, an inverse signal of the input terminal IN is created by the inverter 6, and is outputted to an input terminal INB. However, in a case where there is another control signal as the inverse signal of the signal inputted into the input terminal IN, the control signal may be inputted into the input terminal INB as the inverse signal.

Furthermore, the circuit 60 has a reduction in the electric power consumed by the capacitor. However, it is possible to have, by an external clock operation, (i) an arrangement in which the clock signal CK is stabilized at a certain DC level during the period of time in which the electric potential at the node n1 is stabilized at VSS, or (ii) an arrangement in which a frequency of the clock signal CK is slowed for the sake of a reduction in electric power consumption during the period of time in which the electric potential at the node n1 is stabilized at VSS.

Note that the aforementioned arrangement of the present embodiment, for reducing the clock load by use of the transistor T8, can be suitably applicable to any of the circuits in accordance with Embodiments 1 through 5 in the similar manner to the present embodiment.

Embodiment 7

Figure 16:
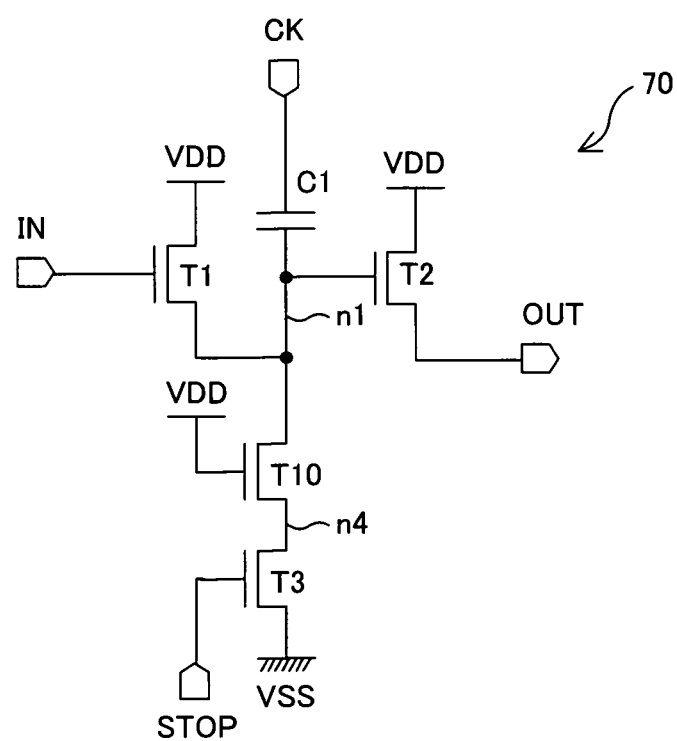
FIG. 16 is a circuit diagram illustrating an arrangement of a circuit in accordance with Embodiment 7 of the present invention.

The following description explains an arrangement of a circuit 70 of the present embodiment. FIG. 16 is a circuit diagram illustrating the arrangement of the circuit 70. Note that as to members having the same functions as those of the members described in Embodiments 1 through 6, the same reference signs are used and explanations of these are omitted here for the sake of simple explanation. Further, the terms defined in Embodiments 1 through 6 are also used in the present embodiment, as defined in Embodiments 1 through 6, if not otherwise specified.

Here, with any of the arrangements of the circuits in accordance with Embodiments 1 through 6, the boosting operation by the clock signal CK causes the node n1 to have a high electric potential of "VDD−Vth+α". Therefore, there arises a risk that a high voltage is applied to the transistor connected to the node n1, specifically, (i) between the gate and the source, (ii) between the gate and the drain, and (iii) between the source and the drain, so that the transistor might be broken due to the high voltage exceeding a withstand voltage of the transistor.

Specifically, in the circuit 10, a high voltage is applied to, particularly, (i) between the gate and the drain of the transistor T3, and (ii) between the source and the drain of the transistor T3. In a case where the input signal IN is being at VSS and the electric potential at the node n1 is boosted, the electric potential at the node n1 increases to "VDD−Vth+α". Therefore, both of the voltage between the gate and the drain of the transistor T3 and the voltage between the source and the drain of the transistor T3 become "VDD−Vth+α−VSS". Here, the following equality can be obtained:

"VDD−Vth+α−VSS=35V−Vth (where VDD=10V, VSS=−10V, and α=15V)".

On the other hand, to the other nodes, an electric potential difference of 20V between VDD and VSS is applied. Thus, a high voltage is applied to the transistor connected to the node n1.

Therefore, in order to protect the transistor against such a high voltage, the circuit 70 of the present embodiment has such an arrangement that any of the circuits in accordance with Embodiments 1 through 6 further includes a transistor T10 (tenth transistor). The circuit 70 illustrated in FIG. 16 has such an arrangement that the circuit 10 illustrated in FIG. 1 includes the transistor T10. The transistor T10 is arranged such that (i) its gate terminal (control terminal) is connected to the power supply VDD, (ii) its drain terminal (first terminal) is connected to the node n1, and (iii) its source terminal (second terminal) is connected to the drain terminal of the transistor T3. A connection point between the transistors T3 and T10 is a node n4.

With the arrangement, in a case where the input signal IN is being at VSS, the electric potential at the node n1 increases to "VDD−Vth+α", but an electric potential at the node n4 increases only up to "VDD−Vth". Therefore, both of the voltage between the gate and the drain of the transistor T3 and the voltage between the source and the drain of the transistor T3 become "VDD−Vth−VSS=20V−Vth", which is lower by the electric potential of α than those in the circuit 10.

Further, the transistor T10 has such low voltages that an electric potential between the gate and the drain is "α−Vth=15V−Vth", an electric potential between the gate and the source is Vth, and an electric potential between the source and the drain is "α=15V".

For this reason, even if the electric potential at the node n1 being in the floating state is boosted due to the clock signal CK, it is possible to reduce a voltage load applied to the transistor connected to the node n1. Therefore, it is possible to constitute a highly-reliable circuit.

Figure 17:
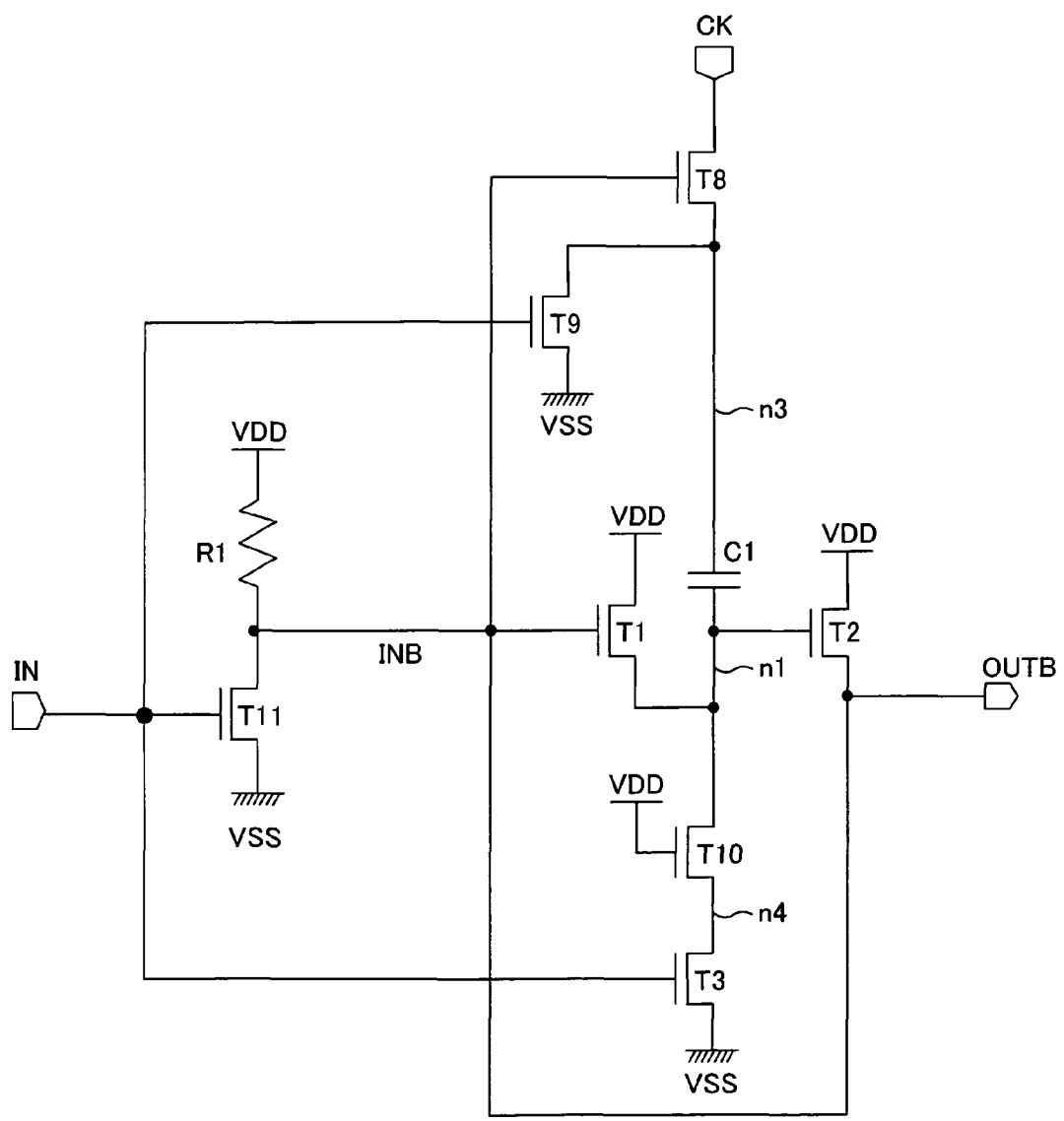
FIG. 17 is a circuit diagram illustrating another arrangement of the circuit in accordance with Embodiment 7 of the present invention.

The aforementioned arrangement of the present embodiment, for protecting the transistor against a high voltage, is applicable to any of the circuits in accordance with Embodiments 1 through 6, in the similar manner to the present embodiment. FIG. 17 illustrates an example in which the arrangement of the present embodiment is applied to the circuit in accordance with Embodiment 6, which circuit is illustrated in FIG. 15.

Here, any of the circuits in accordance with Embodiments 1 through 7 has an arrangement in which the drain terminal of the transistor T1 is connected to the power supply VDD. However, the arrangement of the circuit of the present invention is not limited to this arrangement. For example, it is possible to connect the drain terminal and the gate terminal of the transistor T1 to each other, i.e. a diode connection. FIGS. 18 through 24 are circuit diagrams which illustrate arrangements of circuits 11, 21, 31, 41, 51, 61, and 71, respectively. The arrangements of the circuits 11 through 71 correspond to arrangements of the circuits 10, 20, 30, 40, 50, 60, and 70, respectively, in each of which arrangements the transistor T1 is diode-connected. For example, in a case of the transistor T1 is arranged as in the circuit 10, if noise is generated with respect to an input signal while the transistor T3 is in the on-state and the input signal being inputted into the input terminal IN is being at the low level, the transistor T1 is turned on instantaneously. It follows that a through current flows from the power supply VDD to the power supply VSS via the transistors T1 and T3, thereby causing an increase in consumption current or a false operation. In view of this problem, with the arrangement employing the diode connection, the gate terminal and drain terminal of the transistor T1 are connected to each other, so that even if the generation of noise with respect to the input terminal IN causes the transistor T1 to be turned on, an electric potential difference between the source and the drain equals only an electric potential of the noise. Therefore, as compared with a case where the drain terminal is connected to the power supply VDD, the electric potential difference between the source and the drain is smaller, so that the through current is smaller. Further, since the transistor T3 is in the on-state, even if the transistor T1 is turned on due to the noise, the electric potential fluctuated due to the noise generated with respect to the input terminal IN is withdrawn toward the power supply VSS via the transistor T3. That is, the transistor T1 is affected to be turned off. Therefore, it is possible to prevent a false operation of the transistor T1 due to the influence of the noise.

Figure 18:
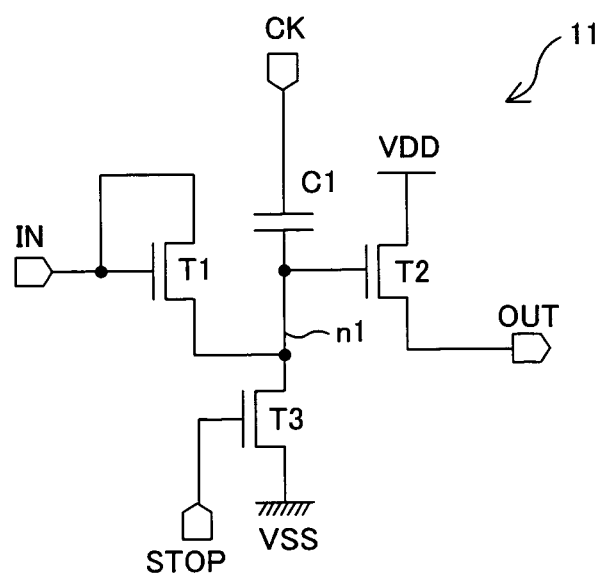
FIG. 18 is a circuit diagram illustrating such an arrangement that a transistor T1 is diode-connected in the circuit illustrated in FIG. 1.
Figure 19:
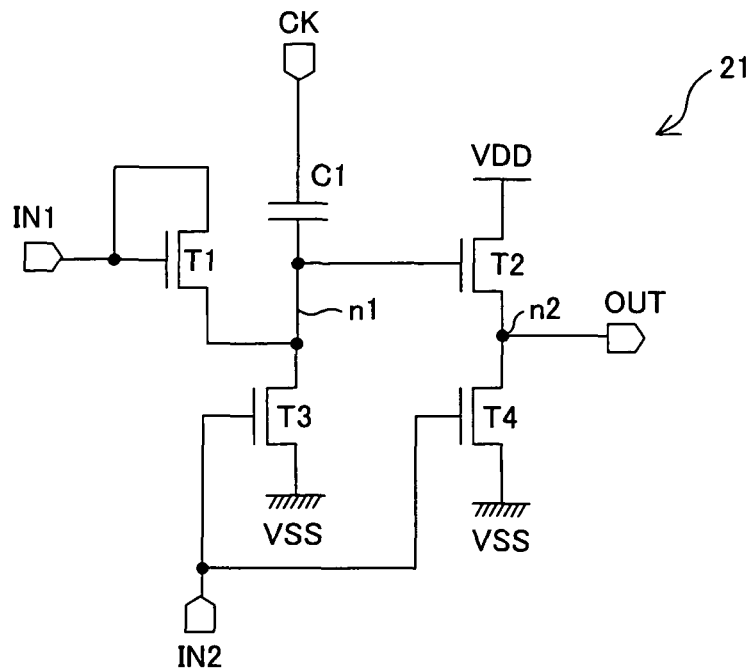
FIG. 19 is a circuit diagram illustrating such an arrangement that the transistor T1 is diode-connected in the circuit illustrated in FIG. 6.
Figure 20:
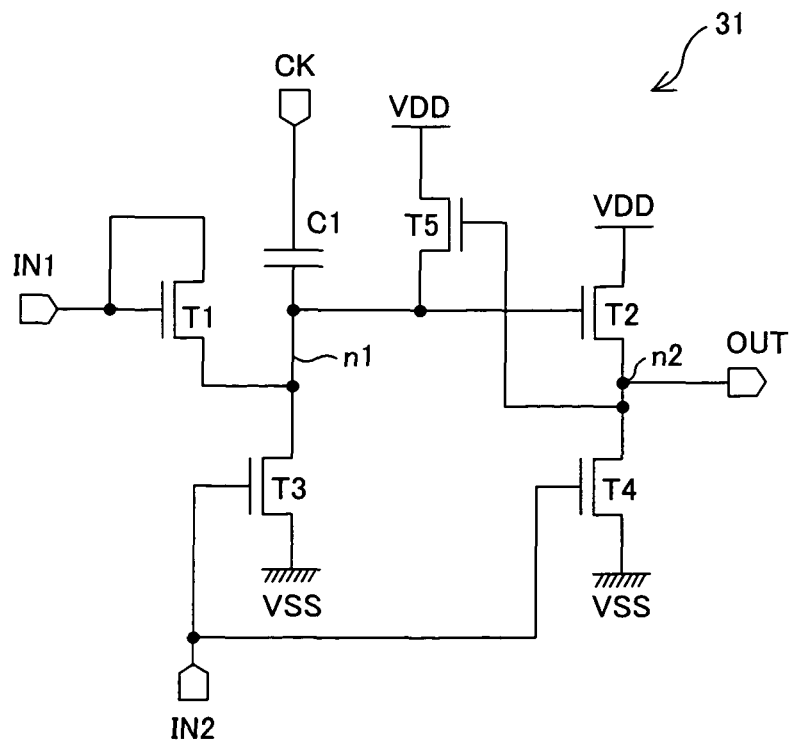
FIG. 20 is a circuit diagram illustrating such an arrangement that the transistor T1 is diode-connected in the circuit illustrated in FIG. 8.
Figure 21:
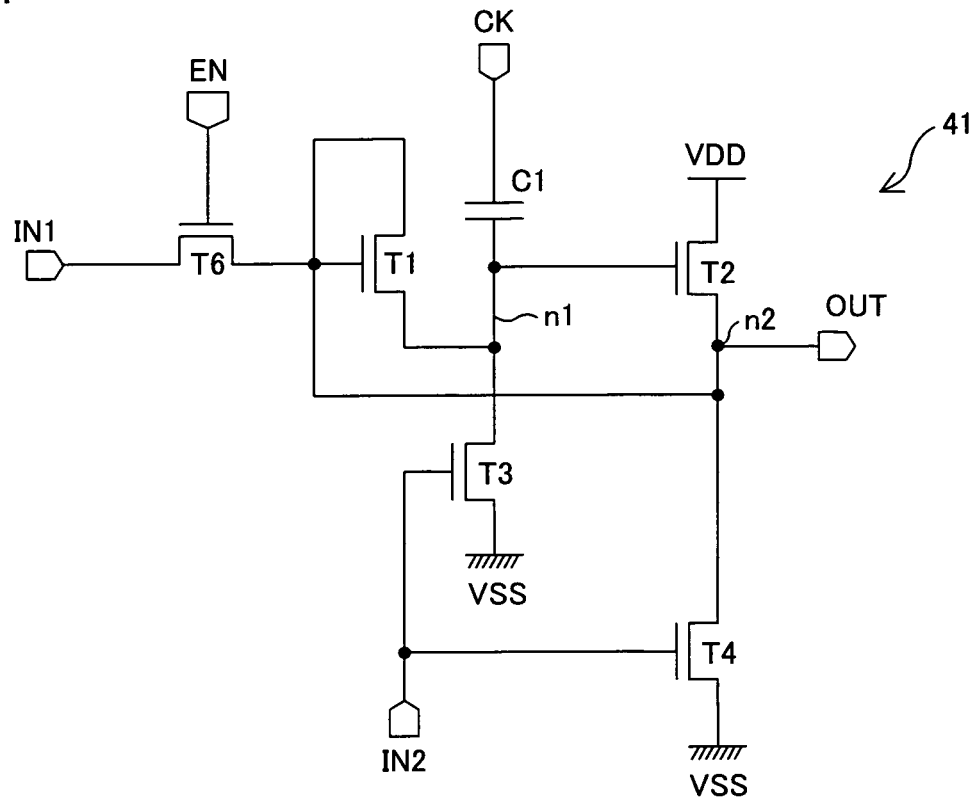
FIG. 21 is a circuit diagram illustrating such an arrangement that the transistor T1 is diode-connected in the circuit illustrated in FIG. 9.
Figure 22:
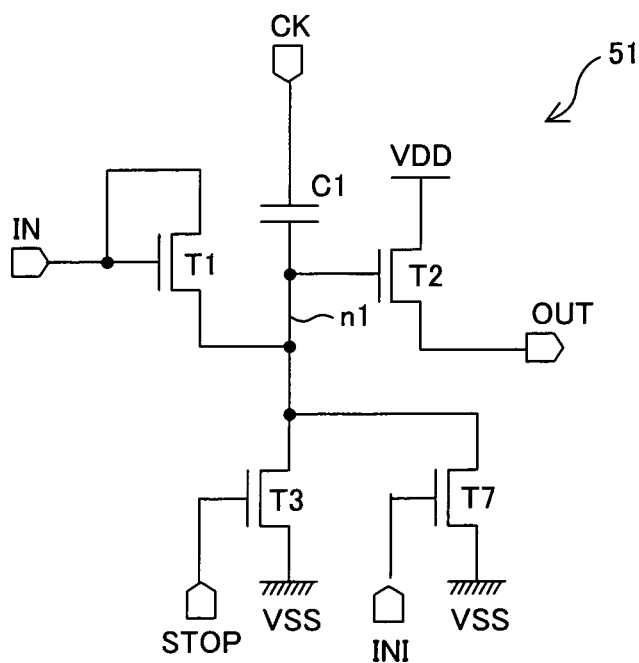
FIG. 22 is a circuit diagram illustrating such an arrangement that the transistor T1 is diode-connected in the circuit illustrated in FIG. 13.
Figure 23:
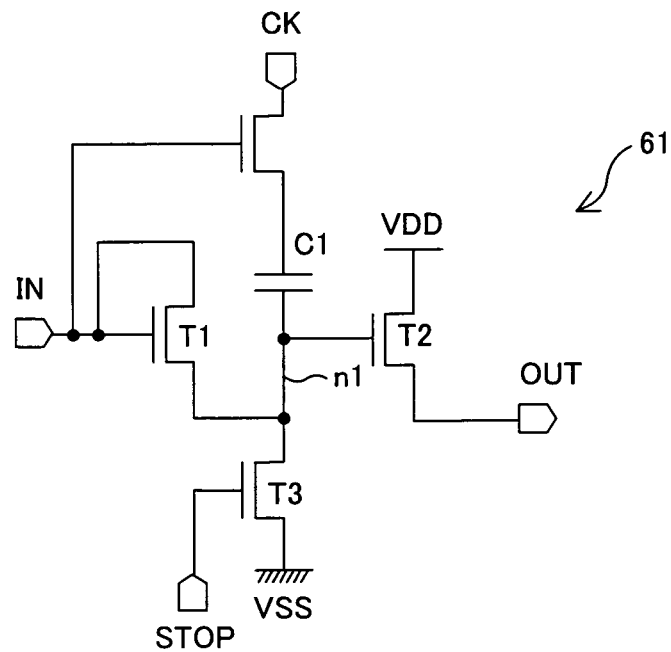
FIG. 23 is a circuit diagram illustrating such an arrangement that the transistor T1 is diode-connected in the circuit illustrated in FIG. 14.
Figure 24:
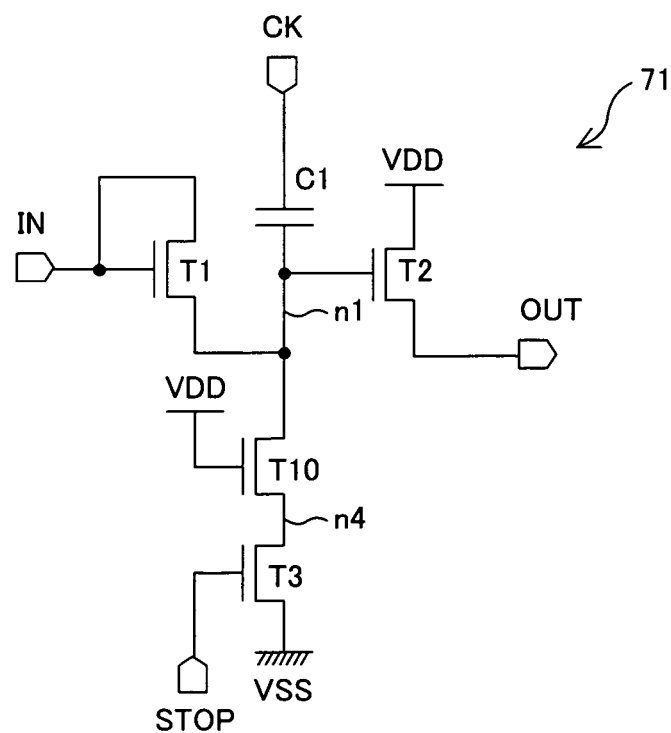
FIG. 24 is a circuit diagram illustrating such an arrangement that the transistor T1 is diode-connected in the circuit illustrated in FIG. 16.
Figure 25:
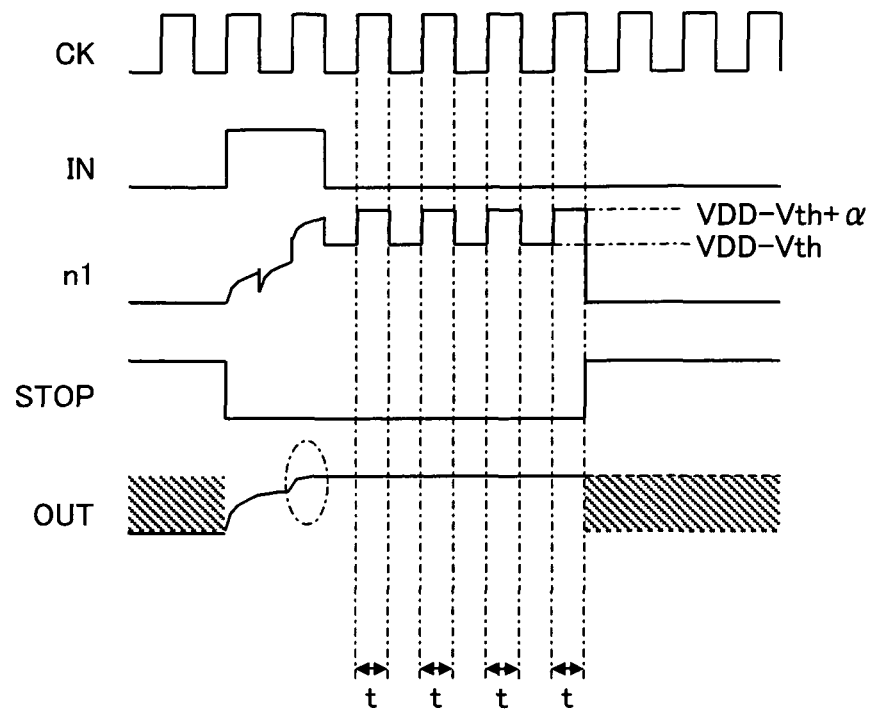
FIG. 25 is a timing chart showing waveforms of various signals of the circuit illustrated in FIG. 18.

FIG. 25 is a timing chart showing waveforms of various signals of the circuit 11 illustrated in FIG. 18, among the circuits described above, in each of which the transistor T1 is diode-connected. As shown in FIG. 25, in the similar manner to the arrangement of the circuit 10 illustrated in FIG. 1, it is possible to output a signal while retaining the electric potential level of the signal inputted into the drain terminal of the transistor T2. Therefore, when the transistor T2 is turned on, VDD is outputted.

Further, the arrangement explained in Embodiment 1 described above, in which arrangement the clock signal φ is inputted into the drain terminal of the transistor T2, is also applicable to any of the circuits in accordance with the embodiments described above. In this case, when the transistor T2 is turned on, the electric potential level of the clock signal φ is outputted.

Figure 26:
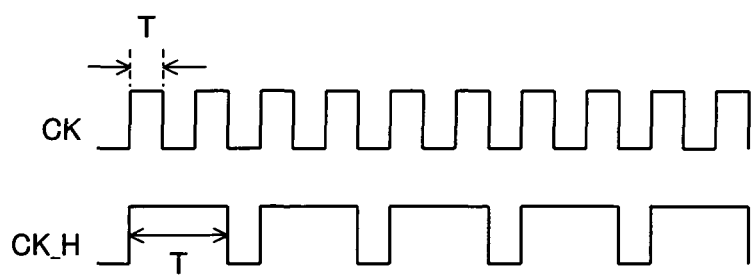
FIG. 26 is a view showing a waveform of a clock signal CK of each of the embodiments of the present invention.

Meanwhile, the clock signal CK inputted into an active signal retaining circuit of the present invention shows such a waveform that the high level and the low level are repeated alternatively and periodically, as shown in FIG. 26. As described above, the output signal OUT of the active signal retaining circuit is has a low impedance particularly while the clock signal CK is being at the high level (period T). Therefore, during a period of time in which a duty ratio of the clock signal CK is, for example, 50% as shown in FIG. 26, the output signal OUT has a low impedance. That is, by adjusting the duty ratio of the clock signal CK, it becomes possible to adjust the period of time during which the output signal OUT has a low impedance.

Here, the following description discusses a preferable value of the duty ratio of the clock signal CK, by referring to the arrangement illustrated in FIG. 1. As described above, when the clock signal CK switches to the low level, the electric potential at the node n1 decreases to "VDD−Vth−β" due to the off-leakage current or the like. Here, an ideal duty ratio is "high level period: low level period=T1−tβ: tβ (where tβ is a period of time required to recharge the electric potential at the node n1 to "VDD−Vth", and T1 is one cycle)". Further, a period of time necessary for the clock signal CK to switch from the high level to the low level is determined in accordance with a time constant of a load (capacitance and resistance) of the clock terminal CK. The period of time necessary for the clock signal CK to switch from the high level to the low level (or vice versa) is referred to as "tck". If the tck is not assured as a pulse width, it would be impossible to obtain a desired boosting voltage a for boosting the node n1. Therefore, in view of the time constant, the ideal duty ratio is "high level period: low level period=T1−tck: tck".

In practice, the recharge for compensating the decrease due to the off-leakage current or the like and the switchover of the clock signal CK from the high level to the low level are carried out simultaneously. Therefore, in consideration of both of them, the ideal duty ratio is "high level period: low level period=T1−tβ': tβ' (where tβ' is a period of time necessary to recharge the electric potential at the node n1 to "VDD−Vth")". With this duty ratio, it becomes possible to decrease the output impedance of the transistor T2 while retaining the active state of the circuit normally.

According to the discussion described above, it is preferable to set the duty ratio of the clock signal such that the period of time of the low level in one cycle of the clock signal CK is equivalent to a period of time from the time when the clock signal CK switches from the high level to the low level, to the time when the electric potential at the node n1 is saturated.

Further, it is preferable to set the duty ratio so that a period of time in which the transistor T2 exhibits a low impedance is longer.

Note that in a case where the period of time for the switchover of the clock signal CK is greater than 50%, the clock signal CK switches to the next high level before completely switching to the low level. For this reason, in order to obtain the boost voltage a, it is necessary to cause (adjust) the capacitor C1 to be larger. This results in a larger-sized circuit, or an increase in the load of the capacitor, thereby requiring a longer period of time for the switchover. In order to avoid this, generally, the period of time for the switchover is set to be within 50% by slowing the frequency of the clock signal, or by setting the load driven by the clock signal CK to be smaller. For this reason, it is preferable that the duty ratio is 50% or more in order to cause the period of time in which the transistor T2 exhibits a low impedance to be longer as much as possible.

FIG. 26 shows a clock signal CK_H, which is an example of a waveform set so that the period T of the high level is longer (duty ratio is set to be greater). This makes it possible to set a longer period of time in which the output signal OUT of the active signal retaining circuit has a low impedance.

Because of the longer period of time of the low impedance, the output signal can be more stable against noise, and the load can be driven more quickly. Thus, it is preferable that the clock signal CK has a frequency higher than that of the output signal OUT, and is simultaneously being at the high level (electric potential on the active side) for a period of time longer than at the low level.

Note that in a case where the p-channel-type transistor is used, the logic is totally reversed. Therefore, in such a case, it is preferable that the clock signal CK is being at the low level for a period of time longer than at the high level for the similar reason to the reason described above.

Figure 27:
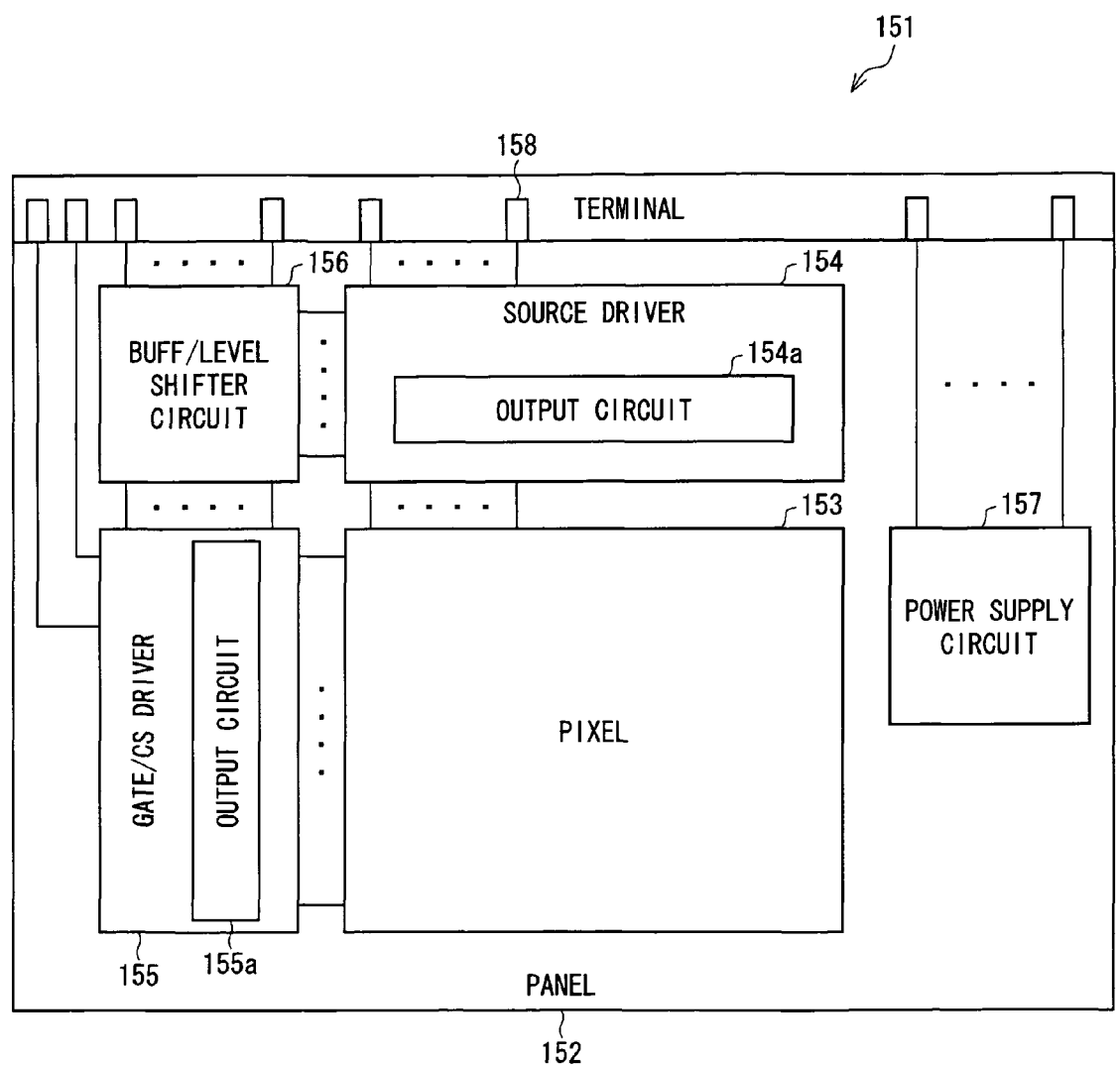
FIG. 27 is a block diagram illustrating an entire arrangement of a liquid crystal display device in accordance with one embodiment of the present invention.

Each of the circuits (active signal retaining circuits) in accordance with Embodiments 1 through 7 described above can be suitably used, particularly, in a liquid crystal display device (display device). FIG. 27 is a block diagram illustrating an entire arrangement of a liquid crystal display device.

A liquid crystal display device 151 includes a panel 152, on which the liquid crystal display device 151 further includes: a pixel region 153; a source driver 154; a gate/CS driver 155; a BUFF/level shifter circuit 156; a power supply circuit 157; and terminals 158 . . . . The source driver 154 includes an output circuit 154a, and outputs a data signal to each of source bus lines of the pixel region 153. The gate/CS driver 155 includes an output circuit 155a, and outputs (i) a selection signal to gate bus lines so as to write, on each pixel of the pixel region 153, the data signal outputted from the source driver 154, and (ii) a CS signal to CS bus lines so as to cause a writing electric potential with respect to each pixel of the pixel region 153 to be larger. Each of the output circuits 154a and 155a is constituted by a buffer which is an amplification circuit for generating a 100%-amplified data signal in accordance with the input signal, which amplifying circuit has a low output impedance. The BUFF/level shifter circuit 156 includes a buffer which is an amplification circuit having a low output impedance, such as a 100%-amplification circuit for compensating attenuation of a signal of an inverter or the like, and a level shifter circuit for converting a power supply level of a signal. The BUFF/level shifter circuit 156 provides the source driver 154 and the gate driver 155 with a signal subjected to a process of such a buffer. The power supply circuit 157 generates a power supply for a logic circuit, a reference voltage of the data signal, a counter voltage of the data signal, an auxiliary capacitance voltage, and the like. Each of the terminals 158 . . . is a terminal for inputting a signal and a power supply into each of the above circuits provided on the panel 152. Note that the liquid crystal display device may include a demultiplexer in place of the source driver.

Each of the circuits in accordance with Embodiments 1 through 7 is applicable to any section of the liquid crystal display device 151. Particularly, each of the circuits is suitably applicable to a switch provided in the CS driver, the buffer circuit, the level shifter circuit, and a shift resister provided in each of the source driver (data signal line driving circuit) and the gate driver (scan signal line driving circuit). The following description explains examples of such application: Example 1 in which the circuit is applied to a memory circuit provided in the CS driver; Examples 2 through 4 in each of which the circuit is applied to the buffer circuit and the level shifter circuit; and Example 5 in which the circuit is applied to the shift resister.

Example 1

Figure 28:
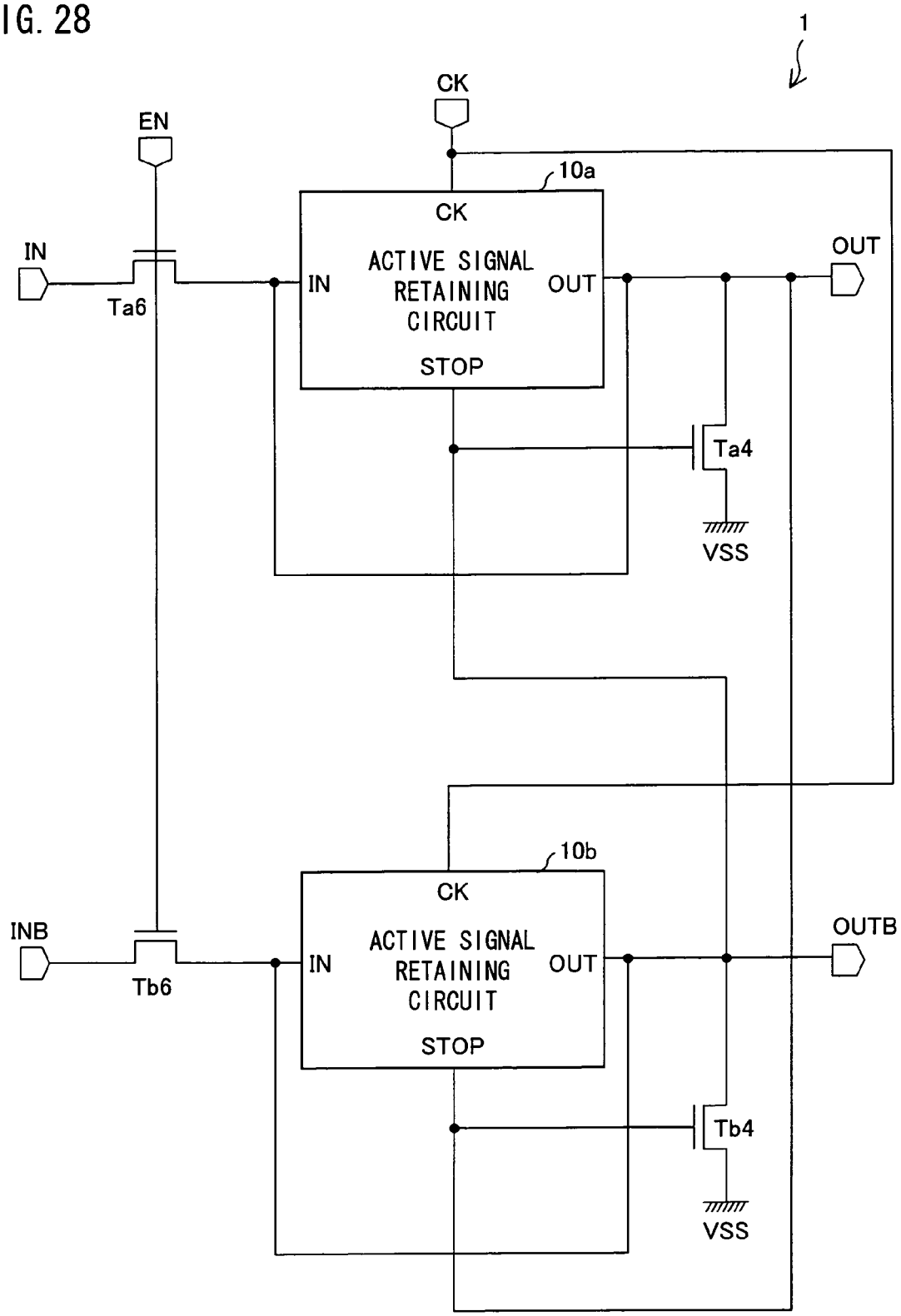
FIG. 28 is a block diagram illustrating an arrangement of a memory circuit in accordance with Example 1 of the present invention, which memory circuit is provided in a CS driver.
Figure 29:
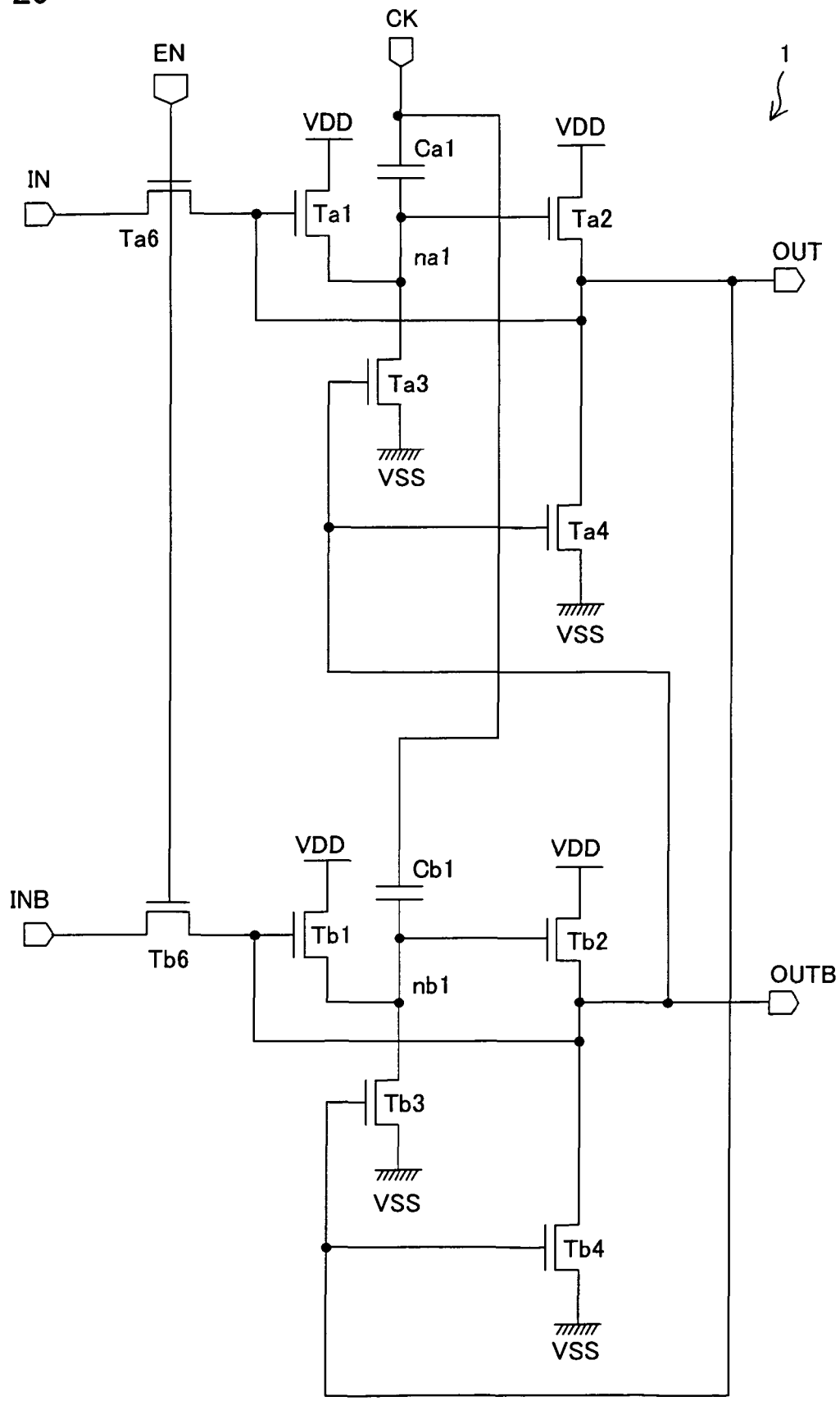
FIG. 29 is a circuit diagram illustrating the arrangement of the memory circuit illustrated in FIG. 28.
Figure 30:
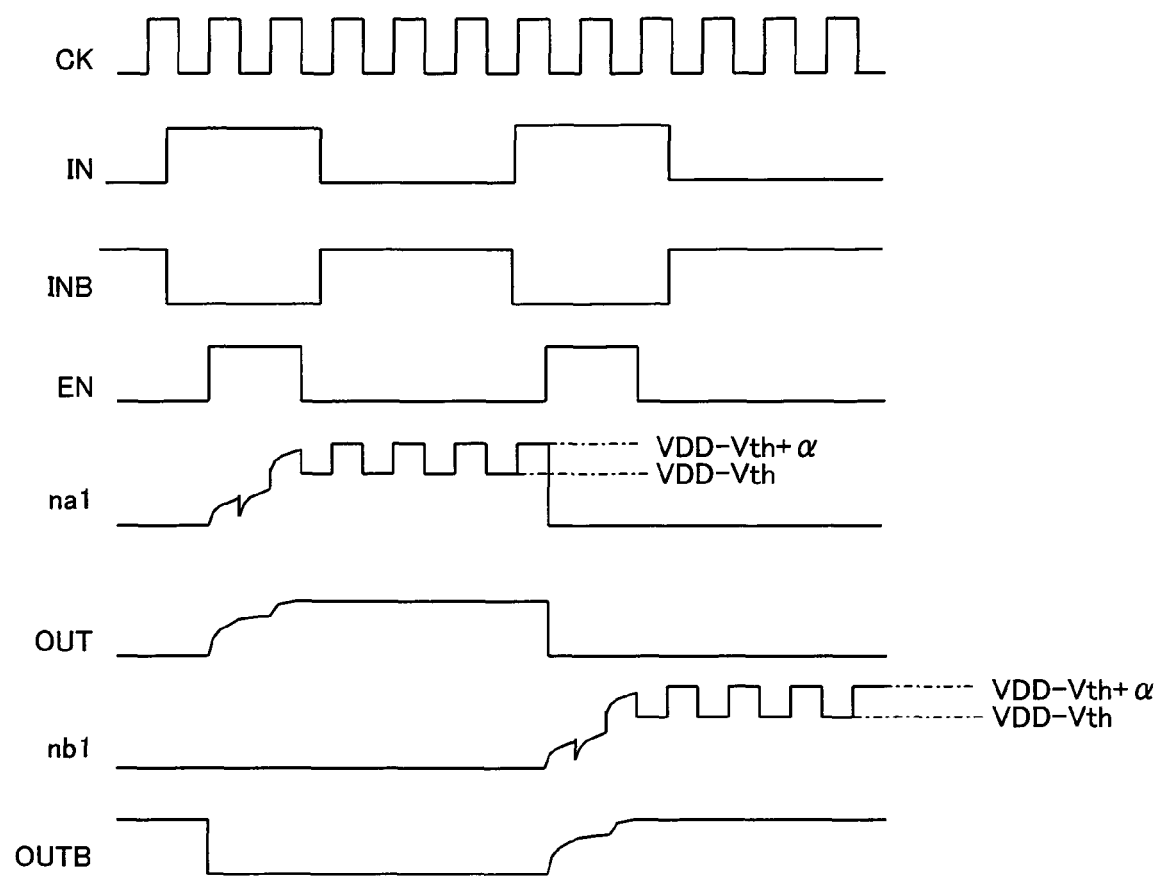
FIG. 30 is a timing chart showing waveforms of various signals of the memory circuit illustrated in FIG. 28.

FIG. 28 is a block diagram illustrating an arrangement of a memory circuit 1 provided in a CS driver of the present example, and FIG. 29 is a circuit diagram of the memory circuit 1. FIG. 30 is a timing chart showing waveforms of various signals of the memory circuit 1. The memory circuit 1 includes two circuits (active signal retaining circuits), corresponding to any one of the circuits described in the embodiments described above. Specifically, for example, the memory circuit 1 has such an arrangement that a STOP terminal of one of the circuits 10 (which is referred to as "circuit 10b") illustrated in FIG. 1, and the output terminal OUT of the other one of the circuits 10 (which is referred to as "circuit 10a") are connected to each other. Note that the memory circuit only has to have at least the arrangement of the circuit 10 illustrated in FIG. 1. The memory circuit 1 of the present example has such an arrangement that the circuit 10 further includes the transistor T4 (in FIG. 28, transistors Ta4 and Tb4), which is the arrangement of the circuit 20 illustrated in FIG. 6.

Next, an operation of the memory circuit 1 is described below. Here, the following explanations deal with an example in which the input signal IN being at the high level is inputted into the circuit 10a and the input signal INB (inverse signal of the input signal IN) being at the low level is inputted into the circuit 10b, while the enable signal EN is being at the high level.

When the signal being at the high level is inputted into the circuit 10a, the circuit 10a turns into the active state. An electric charge is retained at a node na1 while a clock signal is being inputted. Therefore, as described in each of the aforementioned embodiments, an output signal OUT of VDD is outputted from the circuit 10a. This output signal OUT is inputted into the STOP terminal (see FIG. 29) of the other circuit 10b.

When receiving the signal of VDD, the circuit 10b turns into an inactive state, and outputs VSS via the transistor Tb4. Polarities of the input signals IN and INB are opposite to each other, so that one of the circuits outputs VDD while the other one of the circuits outputs VSS. Therefore, during a period of time in which the clock signal CK is being inputted, electric potentials of the circuits 10a and 10b are retained until the next enable signal EN switches to the high level.

Figure 31:
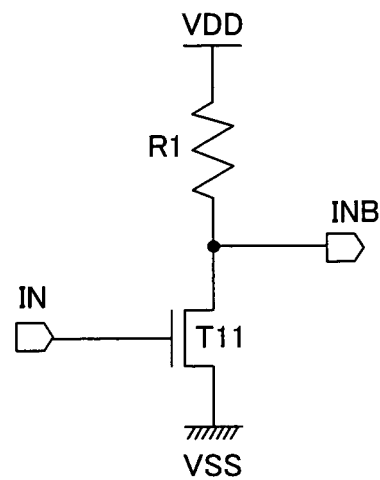
FIG. 31 is a circuit diagram illustrating an arrangement of an inverter circuit for generating an inverse signal INB on the basis of an input signal IN, in the memory circuit illustrated in FIG. 28.
Figure 32:
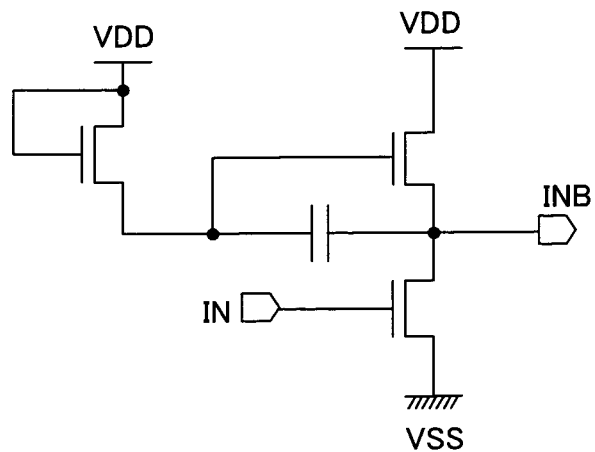
FIG. 32 is a circuit diagram illustrating another arrangement of the inverter circuit for generating the inverse signal INB on the basis of the input signal IN, in the memory circuit illustrated in FIG. 28.

Note that the memory circuit 1 illustrated in FIG. 28 has an arrangement in which the inverse signal INB of the input signal IN is inputted externally, but the present invention is not limited to this arrangement. For example, as another arrangement, it is possible to constitute an inverter circuit in the memory circuit 1, so as to create the inverse signal INB based on the input signal IN, as illustrated in FIGS. 31 and 32. FIG. 31 illustrates an inverter constituted by a resistance R1 and a transistor T11, and FIG. 32 illustrates an inverter constituted by a bootstrap circuit. With these arrangements, a signal being at the low level (VSS) is outputted as the inverse signal INB while the input signal IN is being at the high level (VDD), whereas a signal being at the high level (VDD) is outputted as the inverse signal INB while the input signal IN is being at the low level (VSS).

Further, in order to stabilize the initial state, the memory circuit 1 illustrated in FIG. 28 may further include the transistors T7 (see FIG. 13) described in Embodiment 5, in the respective circuits 10a and 10b, for example. A transistor Ta1 of the circuit 10a and a transistor Tb7 of the circuit 10b are arranged such that (i) an initialization signal INI is inputted into their gate terminal, (ii) their drain terminals are connected to the node na1 and a node nb1, respectively, and (iii) their source terminals are connected to the power supply VSS and the power supply VDD, respectively. With this arrangement, it becomes possible to stabilize the initial state by inputting, at the initial state, the initialization signal INI being at the high level.

Note that the memory circuit 1 has the refresh function described in the aforementioned embodiments, so as to be able to retain a value normally even if being subjected to low frequency driving.

In the present example, the memory circuit 1 includes the circuit 20 in accordance with Embodiment 2 but the present invention is not limited to this. The memory circuit 1 may include any one of the circuits (the circuit 30 the circuit 40, or the circuit 50, for example) in accordance with the other embodiments. The arrangement using such a circuit can also realize the similar effects to those of the present example.

Example 2

Figure 33:
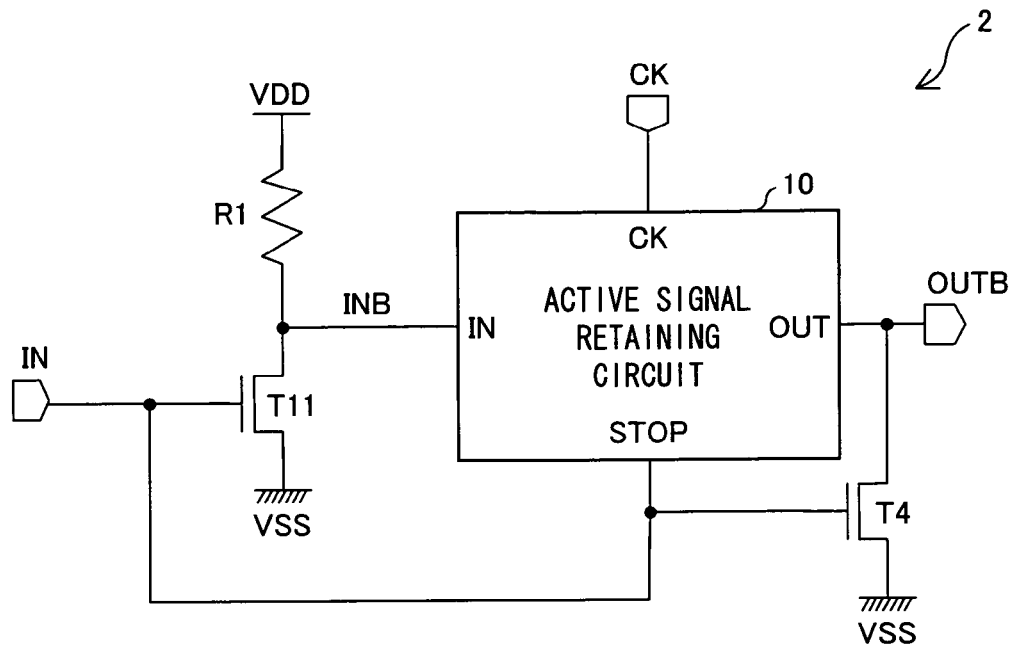
FIG. 33 is a block diagram illustrating an arrangement of a buffer circuit in accordance with Example 2 of the present invention.
Figure 34:
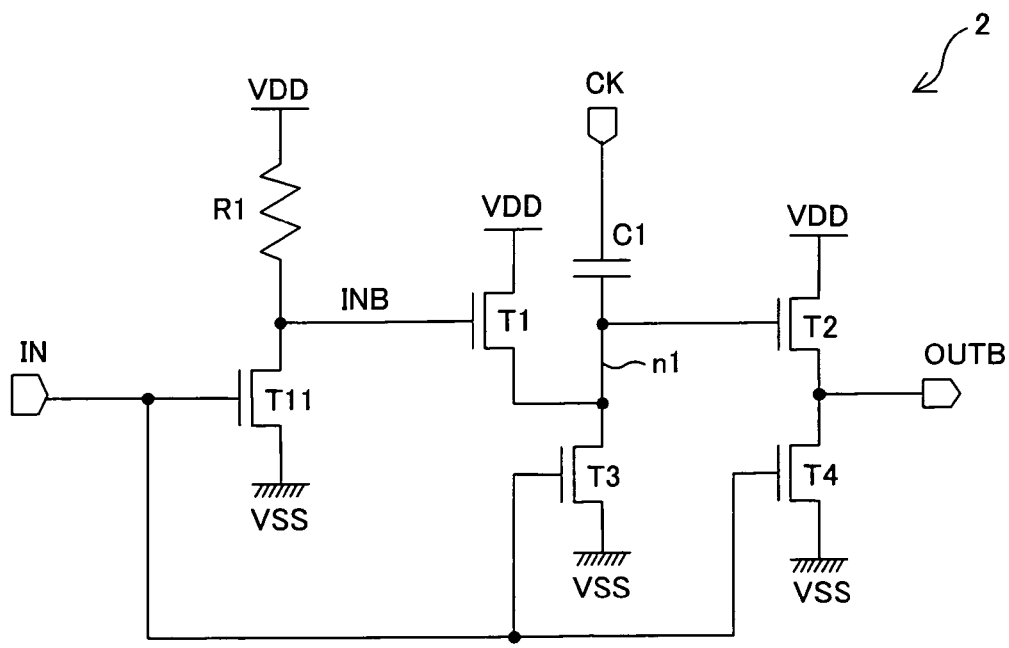
FIG. 34 is a circuit diagram illustrating the arrangement of the buffer circuit illustrated in FIG. 33.

FIG. 33 is a block diagram illustrating an arrangement of a buffer circuit 2 of the present example, and FIG. 34 is a circuit diagram of the buffer circuit 2. The buffer circuit 2 includes any one of the circuits (active signal retaining circuits) in accordance with the embodiments described above. Specifically, the buffer circuit 2 only has to have at least the arrangement of the circuit 10 illustrated in FIG. 1. The buffer circuit 2 of the present example has such an arrangement that the circuit 10 further includes the transistor T4, which is the arrangement of the circuit 20 illustrated in FIG. 6.

Here, the inverter for generating the signal INB to be inputted into the circuit 10 is constituted by the resistance R1 and the transistor T11. Therefore, in a case where the input signal IN of the inverter is being at the high level, a constant current (through current) flows from the power supply VDD to the power supply VSS, thereby increasing electric power consumption. In order to have a reduction in electric power consumption, the resistance R may have a higher resistance value. However, in this case, there arise other new problems such as a decrease in driving capability, and an increase in vulnerability to noise.

In view of the problems, the buffer circuit 2 of the present example has such an arrangement that the output terminal INB of the inverter is connected to only the gate terminal of the transistor T1 of the circuit 10. With this arrangement, the load becomes significantly small. For this reason, even if the driving capability of the inverter decreases (even if the resistance R1 has a higher resistance), the load of the gate terminal of the transistor T1 can be immediately driven. Therefore, it is possible to (i) carry out a high speed operation, and simultaneously (ii) improve the driving capability of the buffer circuit 2 itself by the operation of the circuit 10. Accordingly, with the arrangement, it is possible to constitute a buffer circuit having a high driving capability with low electric power consumption.

Note that in the present example, the buffer circuit 2 includes the circuit 20 in accordance with Embodiment 2, but the present invention is not limited to this. The buffer circuit 2 may include any one of the circuits (the circuit 30, the circuit 40, or the circuit 50, for example) in accordance with the other embodiments described above. The arrangement using such a circuit can also realize the similar effects to those of present example.

Further, in a case where the input signal IN has a voltage other than VDD/VSS (the high voltage lower than VDD/the low voltage of VSS, for example), the buffer circuit 2 of the present example functions as a level shifter circuit.

Figure 35:
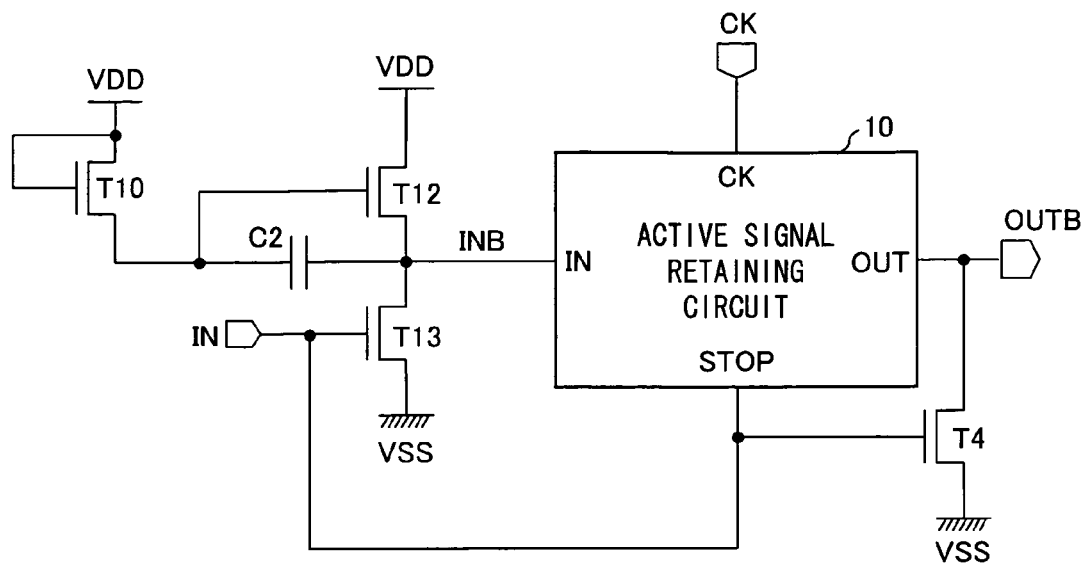
FIG. 35 is a block diagram illustrating such an arrangement that an inverter is constituted by a bootstrap circuit in the buffer circuit illustrated in FIG. 33.
Figure 36:
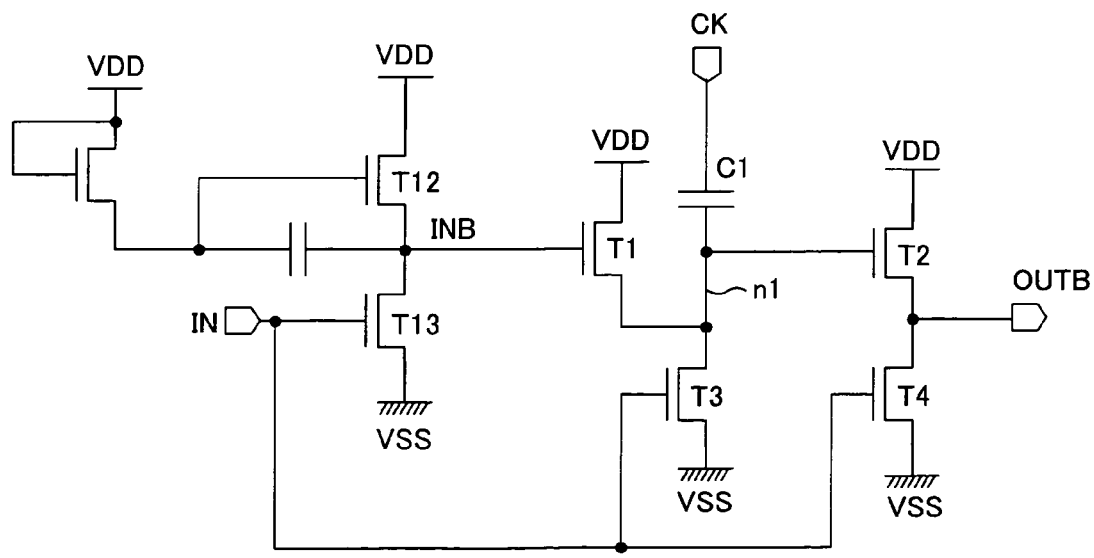
FIG. 36 is a circuit diagram illustrating an arrangement of the buffer circuit illustrated in FIG. 35.

Furthermore, each of the buffer circuit and the level shifter circuit described above may be arranged such that the inverter is constituted by a bootstrap circuit, as illustrated in FIGS. 35 and 36. In such an arrangement, in a case where the input signal IN is being at the high level, a constant current (through current) flows from the power supply VDD to the power supply VSS via transistors T12 and T13, thereby increasing electric power consumption. In order to have a reduction in electric power consumption, the transistors T12 and T13 may have a reduction in size. In this case, however, there arise other problems such as a reduction in driving capability, and an increase in vulnerability to noise, in the same manner as the inverter employing the resistance.

In view of the problems, in the buffer circuit and the level shifter circuit, illustrated in FIGS. 35 and 36, the output terminal INB of the inverter is connected to only the gate terminal of the transistor T1 of the circuit 10, so that it is possible to realize the similar effects to the buffer constituted by the inverter employing the resistance described above.

Example 3

Figure 37:
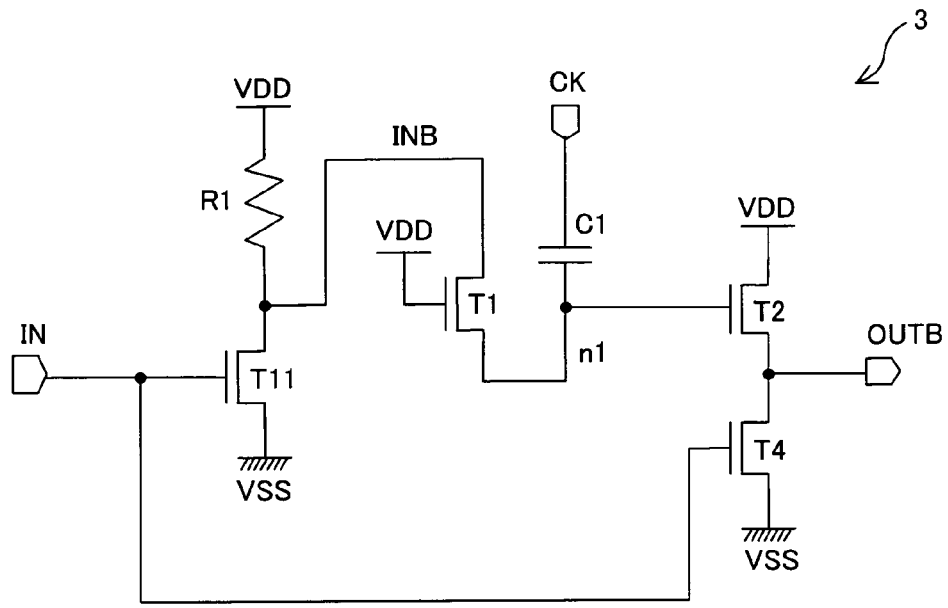
FIG. 37 is a block diagram illustrating an arrangement of a buffer circuit in accordance with Example 3 of the present invention.

Next, the following description explains an example of another arrangement of the buffer circuit. FIG. 37 is a circuit diagram illustrating an arrangement of a buffer circuit 3 of the present example. The buffer circuit 3 includes the inverter illustrated in FIG. 31, and the circuit 20 illustrated in FIG. 6, whose arrangement is modified. Specifically, the buffer circuit 3 has such an arrangement that in the circuit 20 illustrated in FIG. 6, (i) the transistor T3 is omitted, (ii) the gate terminal of the transistor T1 is connected to the power supply VDD, and (iii) the drain terminal of the transistor T1 is connected to the output terminal INB of the inverter. Further, the gate terminal of the transistor T3 is connected to the input terminal IN of the inverter.

Here, the following description explains an operation of the buffer circuit 3 of the present example.

First, in a case where the input signal IN of the inverter is being at the low level, the inverse signal INB is VDD. When the inverse signal INB of VDD is inputted into the transistor T1, the electric potential at the node n1 is charged to "VDD−Vth", and then is increased to "VDD−Vth+α" by the boosting operation by the clock signal CK. The node n1 is connected to the gate terminal of the transistor T2, so that the electric potential of an output signal OUTB is VDD, that is, the electric potential does not decrease by the threshold value.

Next, in a case where the input signal IN of the inverter switches to the high level, the inverse signal INB becomes VSS, and the electric potential at the node n1 is discharged to VSS. Here, the input signal IN is being at the high level, so that the transistor T3 is turned on, and the electric potential of the output signal OUTB becomes VSS.

With the arrangement, the transistor T2 exhibits a low impedance while the electric potential at the node n1 is being high by the boosting operation by the clock signal CK. Therefore, it is possible to (i) output a signal which is stable against noise, and (ii) drive a load quickly.

Further, even if the node n1 loses its electric charge due to a leakage, the transistor T1 is turned on and the electric potential at the node n1 is recharged when the electric potential at the node n1 decreases to lower than "VDD−Vth". Accordingly, it is possible to secure a margin with respect to a false operation during a low frequency operation period.

Further, even if the resistance R1 has a high resistance, since this terminal charges loads of only the parasitic capacitances of the transistors T1 and T2, and the capacitance of the capacitor C1, it is possible to (i) carry out high speed driving, and simultaneously (ii) have a reduction in electric power consumption.

Further, as compared with the arrangement of the buffer circuit 2 in accordance with Example 2, the buffer circuit 3 can have a reduction in size since the arrangement of the buffer circuit 3 does not need the transistor T3 for discharging the node n1.

Note that the buffer circuit 3 of the present example also functions as the level shifter circuit in a case where the input signal IN has a voltage other than VDD/VSS (the high voltage lower than VDD/the low voltage equivalent to VSS, for example).

Figure 38:
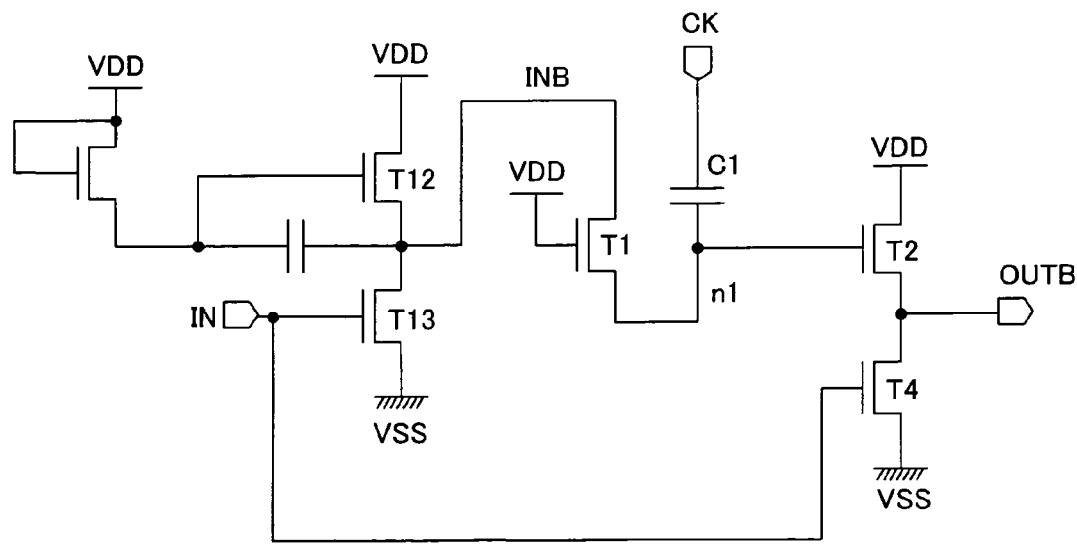
FIG. 38 is a circuit diagram illustrating such an arrangement that an inverter is constituted by a bootstrap circuit in the buffer circuit illustrated in FIG. 37.

Further, each of the buffer circuit and the level shifter circuit described above may be arranged such that the inverter is constituted by the bootstrap circuit in the same manner as in Example 2. FIG. 38 is a circuit diagram illustrating a buffer circuit including the inverter constituted by the bootstrap circuit.

Note that the buffer circuit 2 of Example 2 can normally operate even if the input signal IN is a DC signal.

Further, in the buffer circuit 3 of Example 3, in a case where the input signal IN is the DC signal, the gate terminal of the transistor T12 has a voltage of "VDD−Vth" due to an off-leakage current. For this reason, the output terminal of the inverter has a voltage of "VDD−2×Vth", so that the electric potential at the node n1 becomes "VDD−2×Vth". The electric potential at the node n1 increases to "VDD−2×Vth+α" by the boosting operation by the clock signal CK. By setting the capacitor C1 so that "VDD−2×Vth+α" becomes greater than "VDD+Vth", the buffer circuit 3 can normally operate even if the input signal IN is the DC signal.

Example 4

Figure 39:
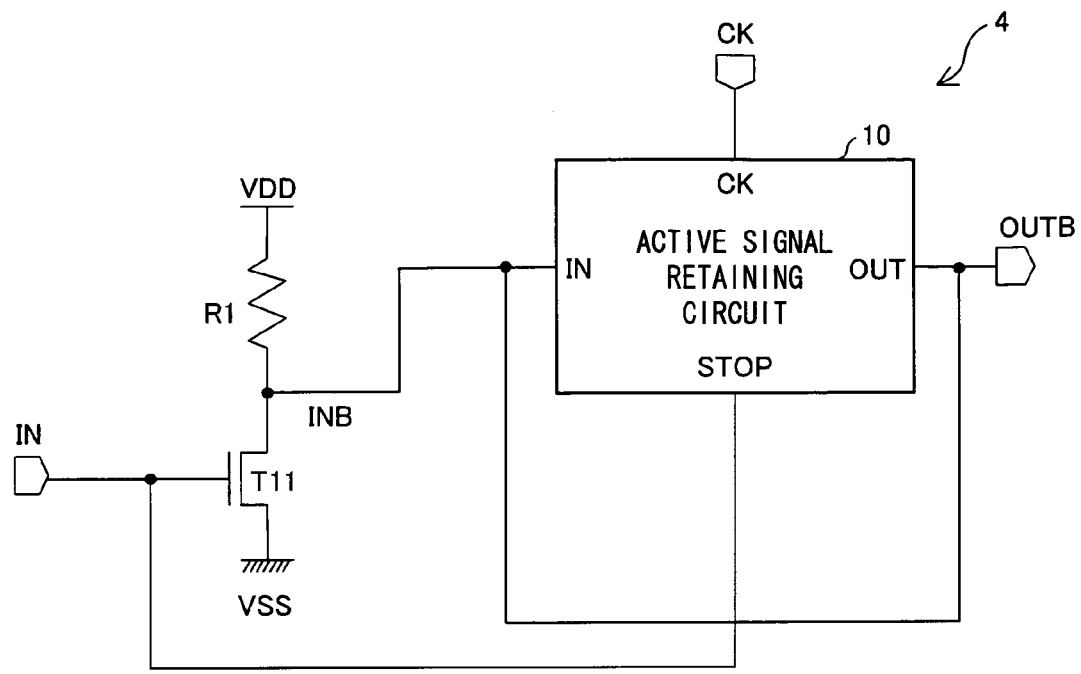
FIG. 39 is a block diagram illustrating an arrangement of a buffer circuit in accordance with Example 4 of the present invention.
Figure 40:
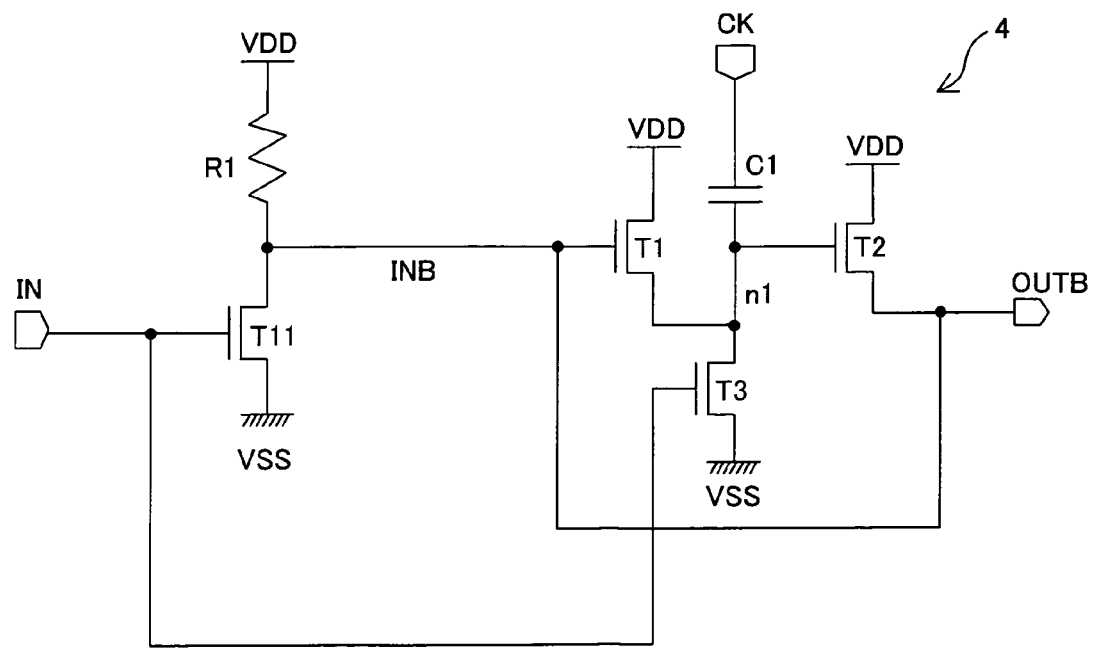
FIG. 40 is a circuit diagram illustrating the arrangement of the buffer circuit illustrated in FIG. 39.

Further, the following description explains an example of still another arrangement of the buffer circuit. FIG. 39 is a block diagram illustrating an arrangement of a buffer circuit 4 of the present example, and FIG. 40 is a circuit diagram of the buffer circuit 4. The buffer circuit 4 includes the inverter illustrated in FIG. 31 and the circuit 10 illustrated in FIG. 1. Specifically, as illustrated in FIG. 40, the buffer circuit 4 is arranged such that (i) the output terminal INB of the inverter is connected to the gate terminal of the transistor T1 and the output terminal OUTB of the buffer circuit 4, and (ii) the gate terminal of the transistor T3 is connected to the input terminal IN of the inverter.

In accordance with the buffer circuit 4 of the present example, in a case where the input signal IN of the inverter is being at the low level, the inverse signal INB is outputted from the high resistance R1. Therefore, the inverse signal INB is a high impedance signal having a voltage of VDD. However, due to the output signal (output signal of the transistor T2) of the circuit 10, the output signal OUTB can be a low impedance signal having a voltage of VDD.

Note that in the buffer circuit 4, the output terminal INB and the output terminal OUTB are connected to each other, so that even if the clock signal CK is stopped, it is possible to output a signal having the electric potential of VDD, that is, the electric potential does not decrease by the threshold value.

Further, the buffer circuit 3 may include any one of the circuits in accordance with other embodiments, in place of the circuit 10. With the arrangement employing such a circuit, it is also possible to realize the similar effects to those of the present example.

Note that the buffer circuit 4 of the present example also functions as the level shifter circuit in a case where the input signal IN has a voltage other than VDD/VSS (the high voltage lower than VDD/the low voltage equivalent to VSS, for example).

Further, the buffer circuit 4 of the present example can normally operate even if the input signal IN is a DC signal, in the same manner as the buffer circuit 2 of Example 2 and the buffer circuit 3 of Example 3.

Here, in the buffer circuits of Examples 1 through 4, the input signal IN and the inverse signal INB may be replaced with each other.

Example 5

Figure 41:
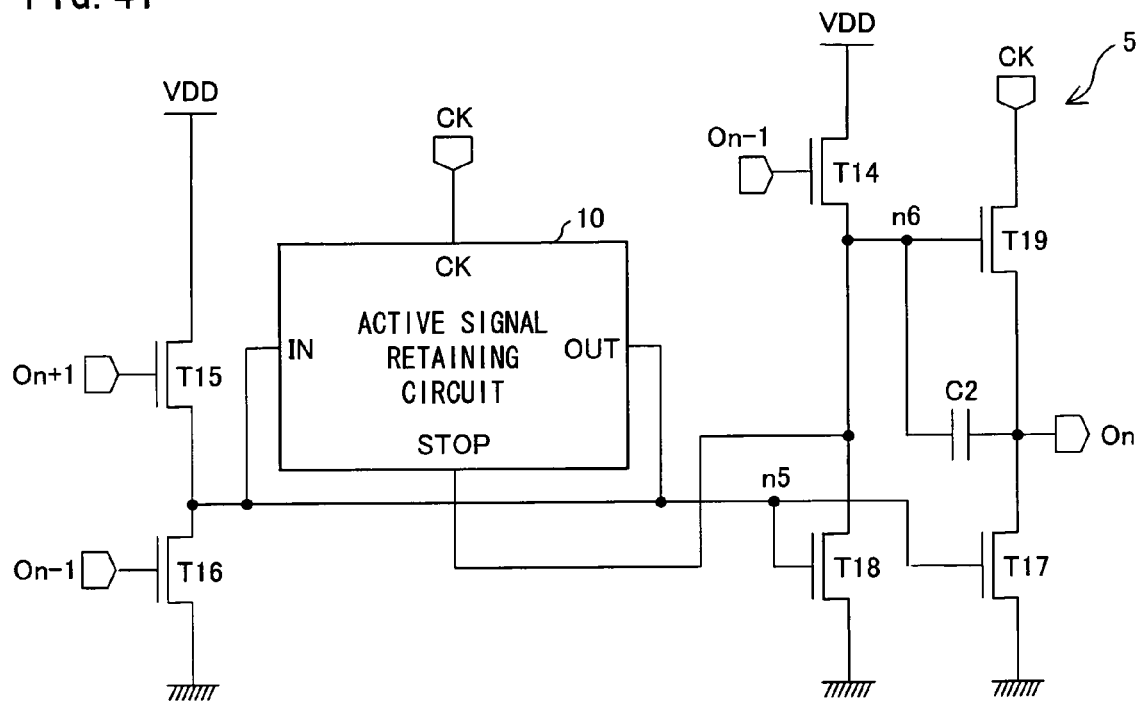
FIG. 41 is a block diagram illustrating an arrangement of a unit circuit in accordance with Example 4 of the present invention, which unit circuit constitutes a shift resister.

FIG. 41 is a block diagram illustrating an arrangement of a unit circuit 5 constituting a shift resister in accordance with the present example. The shift resister is constituted such that the unit circuits 5 illustrated in FIG. 41 are cascade-connected. The unit circuit 5 includes the circuit (active signal retaining circuit) 10 in accordance with Embodiment 1. Note that except the circuit 10, the unit circuit 5 can adopt a conventional arrangement.

Here, with an arrangement of a unit circuit of a conventional shift resister, in a case where both input signals "On−1" and "On+1" are being at the low level, a node n5 turns into the floating state. Therefore, there arises a problem of a reduction in margin with respect to a leakage and noise.

In view of this problem, the unit circuit 5 of the shift resister in accordance with the present example has an arrangement in which the output signal of the circuit 10 is fed back to an input side of the circuit 10. This allows the node n5 to be retained at the high level (in a non-floating state), so that it is possible to retain a disable state of the shift resister. Therefore, it is possible to solve the problem regarding the leakage and noise.

Note that the shift resister in which the unit circuits 5 are cascade-connected is arranged such that (i) among clock signals CK1 and CK2 which do not switch to the high level together at the same time, the clock signal CK1 is inputted into the clock terminals CK of the unit circuits at even stages, and the clock signal CK2 is inputted into the clock terminals CK of the unit circuits 5 at odd stages, and (ii) the input signal "On−1" is an output signal of the unit circuit 5 being at a former stage, and the input signal "On+1" is an output signal of the unit circuit 5 being at a subsequent stage.

With the arrangement, in a case where the input signal "On−1" switches to the high level, an electric charge is charged at a bootstrap capacitor C2 via a transistor T14, and a node n6 keeps being in a high level state even after the input signal "On−1" switches to the low level. Further, a transistor T16 is turned on, so that the node n5 changes to be at the low level. When the clock signal CK switches to the high level, the clock signal CK is outputted from an output terminal On due to a bootstrap effect. Further, when the input signal "On+1" switches to the high level, the node n5 changes to be at the high level via the transistor T15, and the output signal On switches to the low level by turning-on of a transistor T17.

Further, the input signal IN of the circuit 10 switches to the high level, so that the transistor T1 is turned on, and an electric charge is charged at the capacitor C1. After these operations, the electric potential of the output signal OUT is increased to VDD via the transistor T2 every input of the clock signal CK, so that the electric potential at the node n5 does not decrease due to an off-leakage current or the like. Moreover, the output signal OUT of VDD is fed back to the input terminal IN, so that the electric potential at the node n5 is retained at VDD until the next time the input signal "On−1" switches to the high level.

As described above, by applying the circuit (active signal retaining circuit) in accordance with Embodiment 1, to the conventional shift resister, it becomes possible to successfully retain the electric potential at the node n5 at VDD, which electric potential decreases by a threshold value, or decreases due to a leakage or the like, in the arrangement of the conventional shift resister.

In the present example, the shift resister includes the circuit 10 in accordance with Embodiment 1 described above. However, the shift resister may include any of the circuits in accordance with the other embodiments described above, in place of the circuit 10. With the arrangement employing such a circuit, it is also possible to realize the similar effects to those of the present example.

Figure 42:
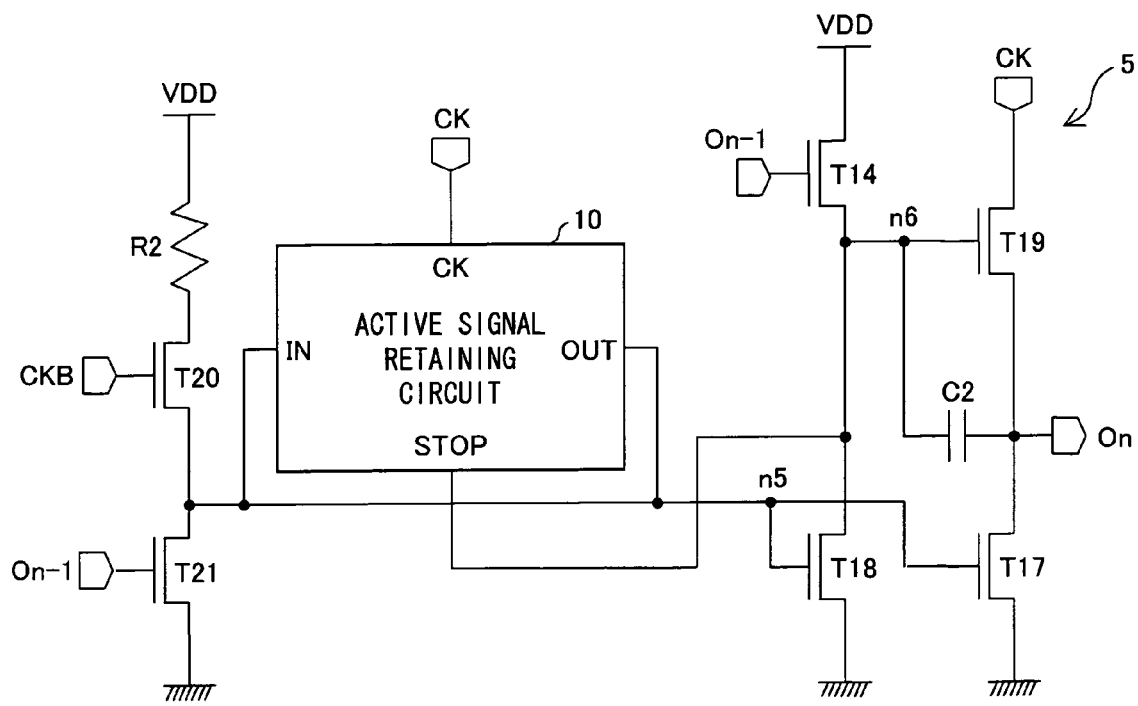
FIG. 42 is a block diagram illustrating another arrangement of the unit circuit illustrated in FIG. 41, which unit circuit constitutes the shift resister.
Figure 43:
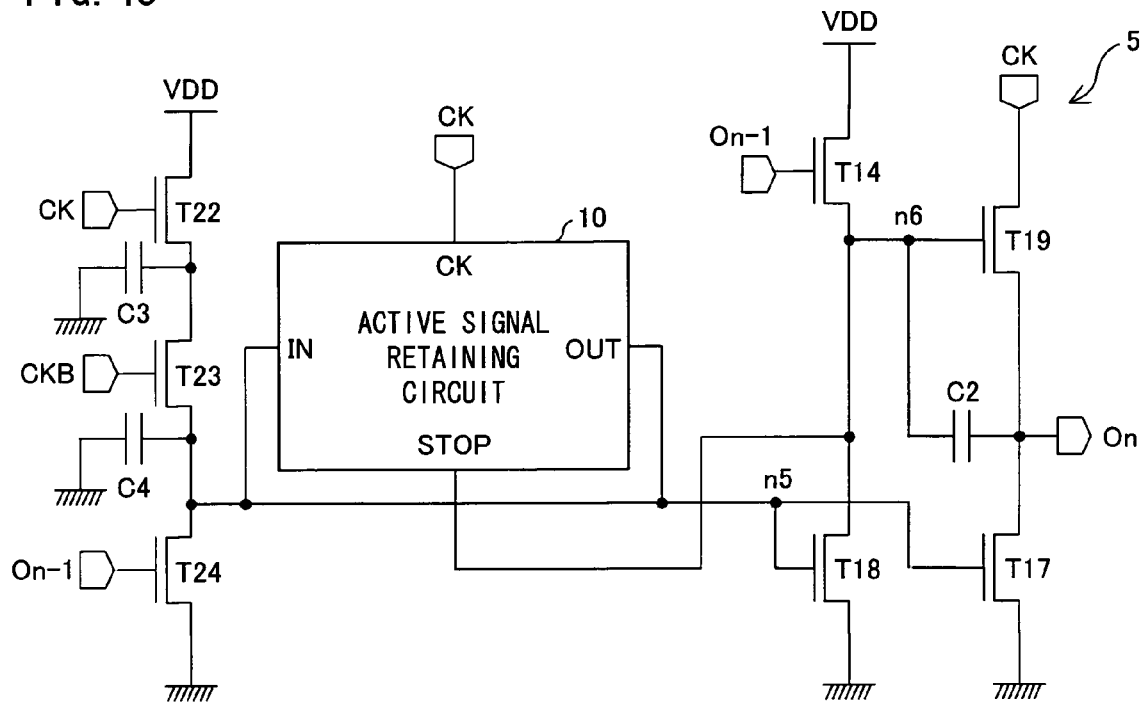
FIG. 43 is a block diagram illustrating still another arrangement of the unit circuit illustrated in FIG. 41, which unit circuit constitutes the shift resister.

Further, the arrangement of the shift resister, to which the circuit of each of the embodiments is applicable, is not particularly limited. For example, as illustrated in FIGS. 42 and 43, another arrangement of the shift resister may be such that the unit circuit at every stage in the shift resister does not use the output signal of the unit circuit at the subsequent stage, that is, each unit circuit generates a reset signal within each unit circuit. With such an arrangement, it is possible to retain the disable state in the similar manner to the present example. Note that each unit circuit is arranged such that (i) among the clock signals CK1 and CK2 which do not switch to the high level together at the same time, the clock signal CK1 is inputted into the clock terminals CK of the unit circuits at the even stages, and the clock signal CK2 is inputted into the clock terminals CKB of the unit circuits at the even stages, (ii) the clock signal CK2 is inputted into the clock terminals CK of the unit circuits at the odd stages, and the clock signal CK1 is inputted into the clock terminals CKB of the unit circuits at the odd stages, and (iii) the input signal "On−1" is an output signal of the unit circuit 5 being at the former stage.

In the unit circuit 5 illustrated in FIG. 42, an electric charge is charged at the bootstrap capacitor C2 by the output signal "On−1" of the unit circuit 5 being at the former stage. Then, in a case where the clock signal CKB switches to the high level after the clock signal CK is outputted to the output terminal On, a transistor T20 is turned on so that the electric potential at the node n5 changes to be at the high level by a resistance R2.

In the unit circuit 5 illustrated in FIG. 43, an electric charge is charged at the bootstrap capacitor C2 by the output signal "On−1" of the unit circuit 5 being at the former stage. Then, after the clock signal CK is outputted from the output terminal On, the electric charge of a capacitor C3 is transferred to a capacitor C4 every input of the clock signals CK and CKB, so that the electric potential at the node n5 changes to be at the high level.

Further, in each of the unit circuit 5 illustrated in FIG. 42 and the unit circuit 5 illustrated in FIG. 43, in the similar manner to the above example, the circuit 10 retains the electric potential at the node n5 at VDD until the next time the input signal "On−1" switches to the high level.

Figure 44:
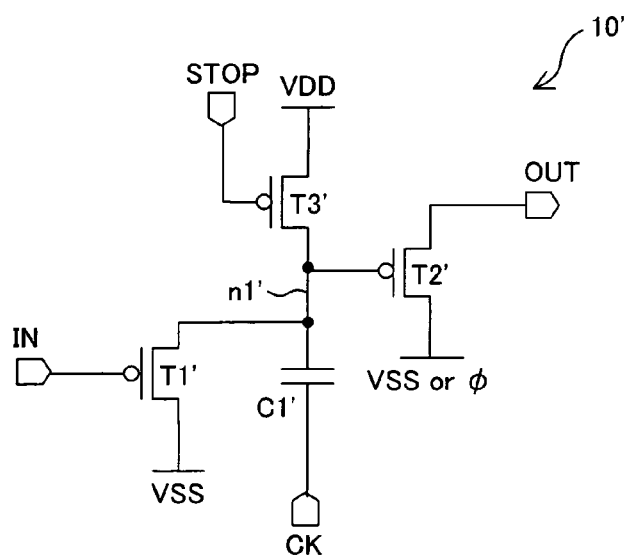
FIG. 44 is a circuit diagram illustrating such an arrangement that the circuit illustrated in FIG. 1 is constituted by p-channel-type transistors.
Figure 45:
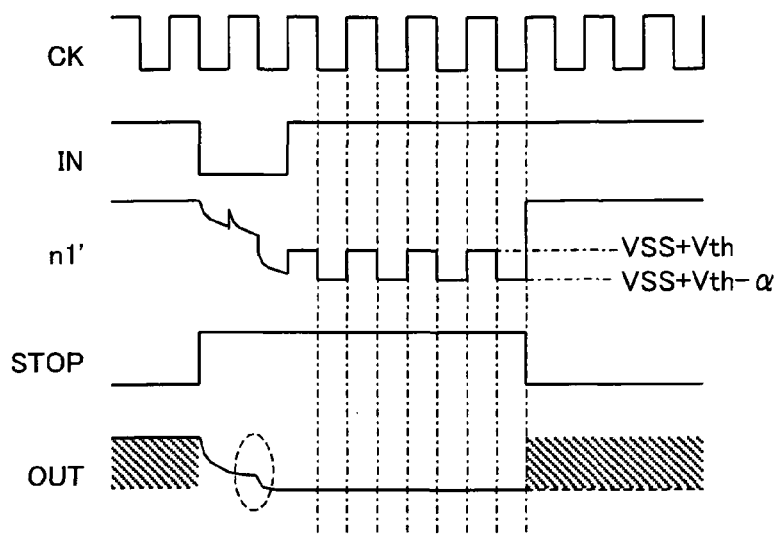
FIG. 45 is a timing chart showing waveforms of various signals of the circuit illustrated in FIG. 44: (a) of FIG. 45 shows waveforms in a case where VSS is inputted into a source terminal of a transistor T2'; and (b) of FIG. 45 shows waveforms in a case where a clock signal φ is inputted into the source terminal of the transistor T2'.
Figure 45:
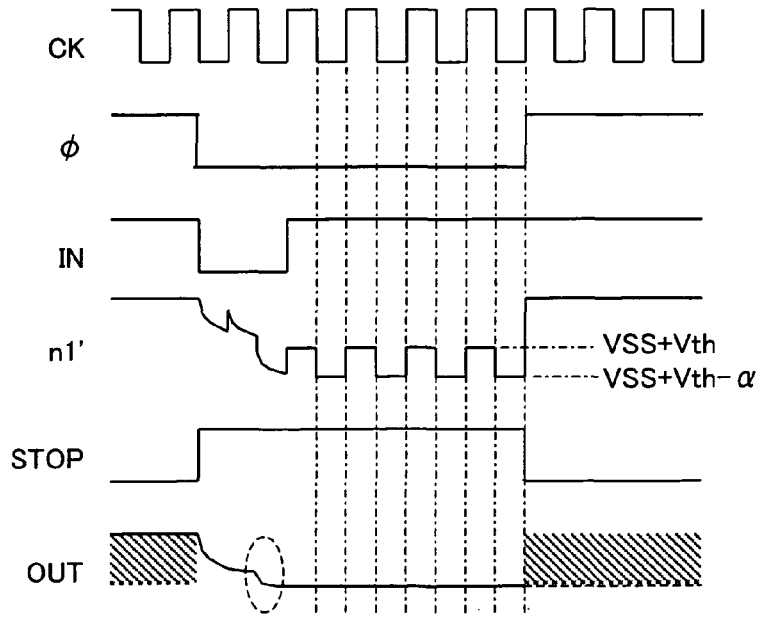

Finally, the following description deals with an example in which any one of the circuits in accordance with the embodiments described above is constituted by p-channel-type transistors. In order to realize, by use of the p-channel-type transistors, the arrangement in accordance with any of Embodiments 1 through 7, and Examples 1 through 5, all of the logics should be reversed. That is, for example, the power supply VDD is replaced with the power supply VSS, the power supply VSS is replaced with the power supply VDD, and the high level is replaced with the low level. FIG. 44 is a circuit diagram of a circuit 10' having such an arrangement that the circuit 10 is constituted by the p-channel-type transistors. Further, FIG. 45 is a timing chart showing waveforms of various signals of the circuit 10': (a) of FIG. 45 shows waveforms in a case where VSS is inputted into a drain terminal of a transistor T2', and (b) of FIG. 45 shows waveforms in a case where the clock signal φ is inputted into the drain terminal of the transistor T2'. With the arrangement, it is also possible to have the effect of stabilizing the output signal in the similar manner to the aforementioned circuit constituted by the n-channel-type transistors.

As described above, a semiconductor device of the present invention includes the capacitor between the connection point between the first and second transistors, and the clock terminal for receiving the clock signal, the clock signal having a frequency higher than a frequency of the output signal outputted from the output terminal.

Further, a display device of the present invention includes the semiconductor device.

Therefore, it is possible to provide: a semiconductor device constituted by transistors of a same conductivity type, which semiconductor device can output a stable signal by preventing a decrease in electric potential level; and a display device including the semiconductor device.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present invention provides a circuit which can output a stable signal by preventing a decrease in electric potential level of an input signal. Therefore, the present invention is suitably applicable to, particularly, a display device.

The invention claimed is:

1. A semiconductor device constituted by a plurality of transistors of a same conductivity type, the semiconductor device comprising:
   among the plurality of transistors, a first transistor including a first terminal for receiving an on-voltage, a second terminal, and a control terminal for receiving an input signal;
   among the plurality of transistors, a second transistor including a first terminal for receiving a first constant voltage having an electric potential identical with that of the on-voltage, a second terminal directly connected to an output terminal, and a control terminal directly connected to the second terminal of the first transistor; and
   a capacitor provided between a connection point between the first transistor and the second transistor, and a clock terminal for receiving a clock signal,
   the clock signal having a frequency higher than a frequency of an output signal outputted from the output terminal,
   wherein among the plurality of transistors, a third transistor including a first terminal directly connected to the connection point, a second terminal for receiving a second constant voltage for turning off a corresponding one of the plurality of transistors, and a control terminal for receiving a control signal.

2. The semiconductor device as set forth in claim 1, further comprising:
   among the plurality of transistors, a fourth transistor including a first terminal connected to the output terminal, a second terminal for receiving the second constant voltage, and a control terminal for receiving the control signal.

3. The semiconductor device as set forth in claim 1, further comprising:
among the plurality of transistors, another transistor which outputs the input signal,
the another transistor including: a first terminal connected to an input terminal; a second terminal connected to the control terminal of the first transistor, and the output terminal; and a control terminal for receiving an enable signal.

4. The semiconductor device as set forth in claim 1, wherein:
the clock signal has such a waveform that a high level and a low level are repeated alternatively and periodically, the clock signal being set so that a period of time of the low level in one cycle is equivalent to a period of time from a time that the clock signal switches from the high level to the low level, to a time that an electric potential at the connection point is saturated.

5. A display device comprising:
a semiconductor device as set forth in claim 1.

6. A semiconductor device constituted by a plurality of transistors of a same conductivity type, the semiconductor device comprising:
among the plurality of transistors, a first transistor including a first terminal for receiving an on-voltage, a second terminal, and a control terminal for receiving an input signal;
among the plurality of transistors, a second transistor including a first terminal for receiving a first constant voltage having an electric potential identical with that of the on-voltage, a second terminal directly connected to an output terminal, and a control terminal directly connected to the second terminal of the first transistor;
a capacitor provided between a connection point between the first transistor and the second transistor, and a clock terminal for receiving a clock signal, the clock signal having a frequency higher than a frequency of an output signal outputted from the output terminal; and
among the plurality of transistors, another transistor including a first terminal for receiving the first constant voltage, a second terminal connected to the connection point, and a control terminal connected to the output terminal.

7. A semiconductor device constituted by a plurality of transistors of a same conductivity type, the semiconductor device comprising:
among the plurality of transistors, a first transistor including a first terminal for receiving an on-voltage, a second terminal, and a control terminal for receiving and input signal;
among the plurality of transistors, a second transistor including a first terminal for receiving a first constant voltage having an electric potential identical with that of the on-voltage, a second terminal directly connected to an output terminal, and a control terminal directly connected to the second terminal of the first transistor;
a capacitor provided between a connection point between the first transistor and the second transistor, and a clock terminal for receiving a clock signal, the clock signal having a frequency higher than a frequency of an output signal outputted from the output terminal; and
among the plurality of transistors, another transistor including a first terminal connected to the clock terminal, a second terminal for receiving a second constant voltage for turning off a corresponding one of the plurality of transistors, and a control terminal for receiving an initialization signal for stabilizing an initial state of the semiconductor device.

8. A semiconductor device constituted by a plurality of transistors of a same conductivity type, the semiconductor device comprising:
among the plurality of transistors, a first transistor including a first terminal for receiving an on-voltage, a second terminal, and a control terminal for receiving and input signal;
among the plurality of transistors, a second transistor including a first terminal for receiving a first constant voltage having an electric potential identical with that of the on-voltage, a second terminal directly connected to an output terminal, and a control terminal directly connected to the second terminal of the first transistor;
a capacitor provided between a connection point between the first transistor and the second transistor, and a clock terminal for receiving a clock signal,
the clock signal having frequency higher than a frequency of an output signal outputted from the output terminal; and
among the plurality of transistors, another transistor including a first terminal connected to the clock terminal, a second terminal connected to an end of the capacitor, and a control terminal for receiving the input signal.

9. A semiconductor device constituted by a plurality of transistors of a same conductivity type, the semiconductor device comprising:
among the plurality of transistors, a first transistor including a first terminal for receiving an on-voltage, a second terminal, and a control terminal for receiving an input signal;
among the plurality of transistors, a second transistor including a first terminal for receiving a first constant voltage having an electric potential identical with that of the on-voltage, a second terminal directly connected to an output terminal, and a control terminal directly connected to the second terminal of the first transistor;
a capacitor provided between a connection point between the first transistor and the second transistor, and a clock terminal for receiving a clock signal;
among the plurality of transistors, another transistor including a first terminal connected to the connection point, a second terminal, and a control terminal for receiving the first constant voltage; and
among the plurality of transistors, a third transistor including a first terminal directly connected to the second terminal of the another transistor, a second terminal for receiving a second constant voltage for turning off a corresponding one of the plurality of transistors, and a control terminal for receiving a control signal,
the clock signal having a frequency higher than a frequency of an output signal outputted from the output terminal.

10. The semiconductor device as set forth in claim 9, wherein:
the clock signal has such a waveform that a high level and a low level are repeated alternatively and periodically, the clock signal being set so that a period of time of the low level in one cycle is equivalent to a period of time from a time that the clock signal switches from the high level to the low level, to a time that an electric potential at the connection point is saturated.

11. A display device comprising:
a semiconductor device as set forth in claim 9.

* * * * *